US011075252B2

(12) United States Patent
Cha et al.

(10) Patent No.: US 11,075,252 B2
(45) Date of Patent: Jul. 27, 2021

(54) DISPLAY DEVICE

(71) Applicant: Samsung Display Co., Ltd., Yongin-si (KR)

(72) Inventors: Go Eun Cha, Cheonan-si (KR); Keum Dong Jung, Seoul (KR); Suk Kim, Hwaseong-si (KR); Soo Jung Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/840,212

(22) Filed: Apr. 3, 2020

(65) Prior Publication Data
US 2021/0043692 A1    Feb. 11, 2021

(30) Foreign Application Priority Data
Aug. 9, 2019   (KR) .......................... 10-2019-0097627

(51) Int. Cl.
*H01L 27/32* (2006.01)
*H01L 51/52* (2006.01)
*G06K 9/00* (2006.01)

(52) U.S. Cl.
CPC .......... *H01L 27/323* (2013.01); *G06K 9/0004* (2013.01); *H01L 27/3227* (2013.01); *H01L 27/3234* (2013.01); *H01L 27/3244* (2013.01); *H01L 51/5246* (2013.01); *H01L 51/5284* (2013.01); *H01L 51/5293* (2013.01)

(58) Field of Classification Search
CPC ............... H01L 27/323; H01L 27/3234; H01L 27/3244; H01L 27/3227; H01L 51/5293; H01L 51/5284; G06K 9/0004
See application file for complete search history.

(56) References Cited

U.S. PATENT DOCUMENTS

| | | | | |
|---|---|---|---|---|
| 2002/0118321 A1* | 8/2002 | Ge | ..................... | G02F 1/133305 349/73 |
| 2007/0298548 A1* | 12/2007 | Nagata | .................. | G02F 1/1362 438/149 |
| 2008/0121442 A1* | 5/2008 | Boer | ..................... | G06F 3/0421 178/18.09 |
| 2011/0031496 A1* | 2/2011 | Yamazaki | ........... | H01L 27/1225 257/59 |
| 2017/0161543 A1* | 6/2017 | Smith | ................ | G06K 9/00013 |
| 2019/0013368 A1 | 1/2019 | Chung et al. | | |
| 2020/0156108 A1* | 5/2020 | Zhao | ..................... | B06B 1/0215 |

FOREIGN PATENT DOCUMENTS

| | | |
|---|---|---|
| CN | 205910951 U | 1/2017 |
| KR | 10-1376227 B1 | 3/2014 |
| KR | 10-2018-0005588 A | 1/2018 |

* cited by examiner

*Primary Examiner* — Caridad Everhart
(74) *Attorney, Agent, or Firm* — Lewis Roca Rothgerber Christie LLP

(57) ABSTRACT

A foldable display device includes: a first substrate, a first thin-film transistor layer on the first substrate, a light emitting element layer on the first thin-film transistor layer, and a fingerprint sensor layer to receive light reflected by an external object. The fingerprint sensor layer includes: a second substrate under the first substrate, a second thin-film transistor layer under the second substrate, and a light receiving element layer under the second thin-film transistor layer.

20 Claims, 14 Drawing Sheets

DISPLAY DEVICE

CROSS-REFERENCE TO RELATED APPLICATION

This application claims priority to and the benefit of Korean Patent Application No. 10-2019-0097627, filed on Aug. 9, 2019, in the Korean Intellectual Property Office, the entire disclosure of which is incorporated herein by reference.

BACKGROUND

1. Field

Embodiments of the present disclosure relate to a display device.

2. Description of the Related Art

As the information society further develops, the demand for display devices for displaying images is increasing in various forms. For example, display devices are being applied to various electronic devices such as smartphones, digital cameras, notebook computers, navigation devices, and smart televisions. The display devices may be flat panel display devices such as liquid crystal display devices, field emission display devices, and organic light emitting display devices.

An organic light emitting display device displays images using organic light emitting diodes (OLEDs) that generate light through the combination of electrons and holes. Organic light emitting display devices have a fast response speed, high luminance, wide viewing angle, and low power consumption.

Recently, research and development have been conducted on a technology for integrating a fingerprint recognition sensor into a display panel, which is generally the component that occupies the largest area in a display device.

SUMMARY

Aspects of embodiments of the present disclosure include a display device including a fingerprint sensor layer and having a minimized or reduced thickness.

However, aspects of the present disclosure are not restricted or limited thereto. The above and other aspects of embodiments of the present disclosure will become more apparent to one of ordinary skill in the art to which the present disclosure pertains by reference to the detailed description of the present disclosure given below.

According to one or more embodiments of the present disclosure, a display device includes: a first substrate, a first thin-film transistor layer on the first substrate, a light emitting element layer on the first thin-film transistor layer, and a fingerprint sensor layer to receive light reflected by an external object. The fingerprint sensor layer includes a second substrate under the first substrate, a second thin-film transistor layer under the second substrate, and a light receiving element layer under the second thin-film transistor layer.

The display device may further include a light blocking layer between the first substrate and the first thin-film transistor layer, wherein the light blocking layer includes a plurality of holes.

The display device may further include a first thin-film encapsulation layer on the light emitting element layer, and a cover window on the first thin-film encapsulation layer.

A thickness of the fingerprint sensor layer may be smaller than a thickness of the cover window.

A distance between an upper end of the cover window and an upper end of the light blocking layer may be greater than a distance between a lower end of the light blocking layer and a lower end of the fingerprint sensor layer.

A thickness of the cover window may be greater than a distance between a lower end of the light blocking layer and a lower end of the fingerprint sensor layer.

A ratio of a distance between an upper end of the cover window and an upper end of the light blocking layer to a distance between a lower end of the light blocking layer and a lower end of the fingerprint sensor layer may be about 1.5:1 to about 1.9:1.

The fingerprint sensor layer may further include a second thin-film encapsulation layer under the light receiving element layer.

A distance between the holes may be proportional to a thickness of the first thin-film encapsulation layer.

The distance between the holes may be proportional to a distance between light emitting elements of the light emitting element layer.

The fingerprint sensor layer may include a plurality of fingerprint sensors, and each of the holes may correspond to about twenty to thirty fingerprint sensors.

The first thin-film transistor layer may include a plurality of thin-film transistors, and each of the holes may not overlap the thin-film transistors.

The second thin-film transistor layer may include a switching transistor, and the light receiving element layer may include a first electrode under the second thin-film transistor layer and electrically connected to the switching transistor, a light receiving layer under the first electrode, and a second electrode under the light receiving layer and to receive a common voltage.

The first electrode may include a transparent electrode.

The fingerprint sensor layer may further include a light blocking pattern between the second substrate and the second thin-film transistor layer to overlap the switching transistor.

The light blocking pattern may not overlap the light receiving layer.

The display device may further include a touch sensor layer on the first thin-film encapsulation layer, a polarizing layer on the touch sensor layer, and an adhesive member between the polarizing layer and the cover window.

A sum of thicknesses of the touch sensor layer, the polarizing layer, and the adhesive member may be greater than a thickness of the fingerprint sensor layer.

The second substrate may be attached to a bottom of the first substrate by a transparent adhesive member.

The light receiving element layer may include a phototransistor or a photodiode.

BRIEF DESCRIPTION OF THE DRAWINGS

These and/or other aspects will become apparent and more readily appreciated from the following description of some embodiments, taken in conjunction with the accompanying drawings in which.

DETAILED DESCRIPTION

Figure 1:
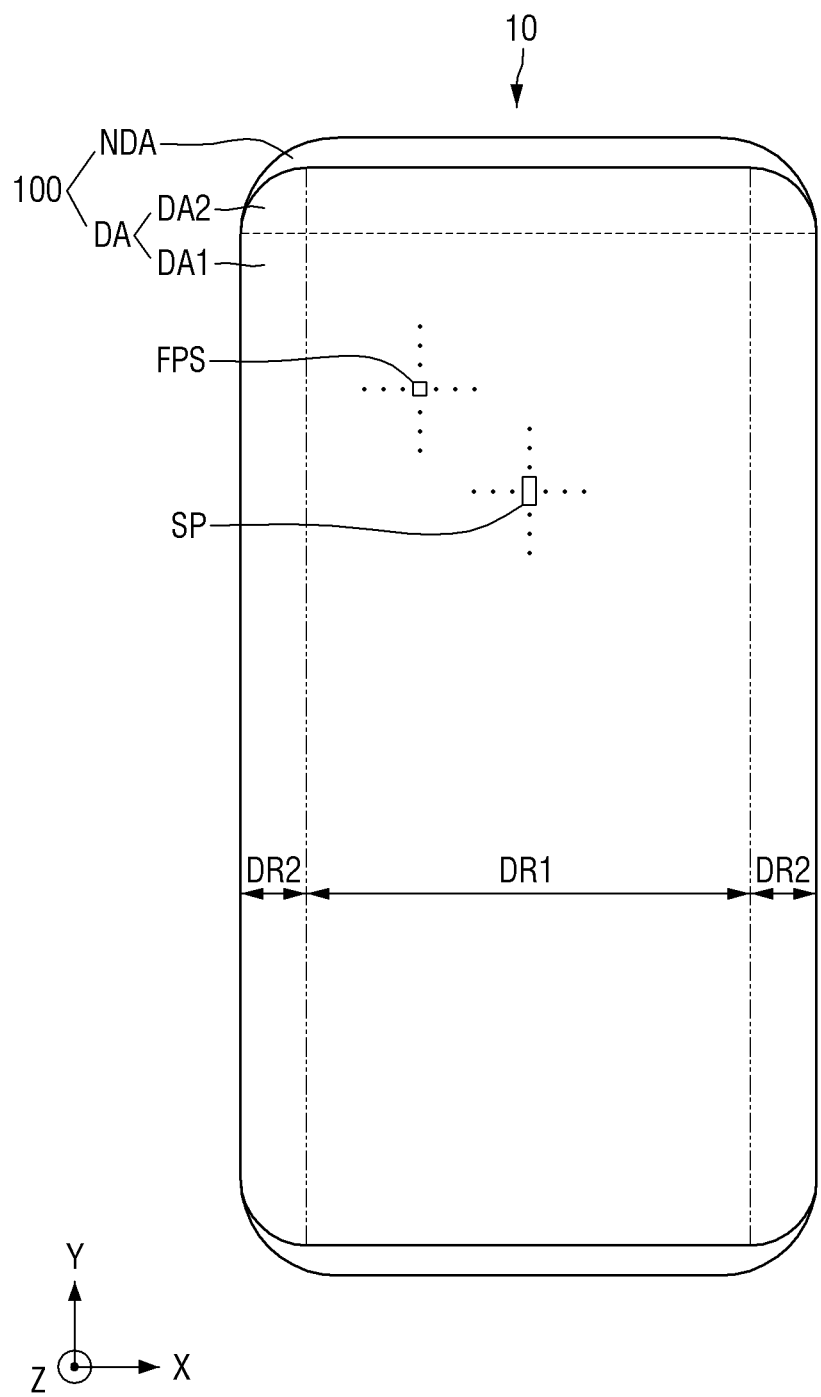
FIG. 1 is a plan view of a display device according to an embodiment.

In the following description, for the purposes of explanation, some details are set forth in order to provide a thorough understanding of various exemplary embodiments or implementations of the present disclosure. As used herein "embodiments" and "implementations" are interchangeable words that refer to non-limiting examples of devices or methods of the present disclosure. It is apparent, however, that various exemplary embodiments may be practiced without these details or with one or more equivalent arrangements. In some instances (e.g., in some drawings), generally available structures and devices are shown in block diagram form in order to avoid unnecessarily obscuring various exemplary embodiments. Further, various exemplary embodiments may be different, but do not have to be exclusive. For example, shapes, configurations, and characteristics (e.g., features) of an exemplary embodiment may be used or implemented in another exemplary embodiment without departing from the present disclosure.

Unless otherwise specified, the illustrated exemplary embodiments are to be understood as providing exemplary features of varying amounts of detail of some ways in which the subject matter of the present disclosure may be implemented or embodied in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless otherwise specified. Further, in the accompanying drawings, the size and relative sizes of elements may be exaggerated for clarity and/or descriptive purposes. When an exemplary embodiment may be implemented differently, a described process order may be performed differently than the described order. For example, two consecutively described processes may be performed at the same time or at substantially the same time, or may be performed in an order opposite to the described order. Also, like reference numerals denote like elements.

When an element, such as, for example, a layer, is referred to as being "on," "connected to," or "coupled to" another element or layer, it may be directly on, connected to, or coupled to the other element or layer, or intervening elements or layers may be present. When, however, an element or layer is referred to as being "directly on," "directly connected to," or "directly coupled to" another element or layer, there are no intervening elements or layers present. The term "connected" may refer, for example, to physical, electrical, and/or fluid connection, with or without intervening elements. Further, the X-axis, the Y-axis, and the Z-axis are not limited to three axes of a rectangular coordinate system, such as, for example, the x, y, and z axes, and may be interpreted in a broader sense. For example, the X-axis, the Y-axis, and the Z-axis may be perpendicular (e.g., substantially perpendicular) to one another, or they may represent different directions that are not perpendicular (e.g., not substantially perpendicular) to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for example, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as, for example, "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings or as provided in the described embodiments. Spatially relative terms are intended to encompass different orientations of an apparatus in use, operation, and/or manufacture in addition to the orientation depicted in the drawings or as provided in the described embodiments. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein may be interpreted accordingly.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of some exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the illustrated and/or described shapes of regions, but should be construed to include deviations in shapes that result from, for example, manufacturing. In this manner, regions illustrated in the drawings may be schematic in nature and the shapes of these regions may not reflect actual shapes of regions of a device and, as such, are not intended to be limiting.

As is customary in the field, some exemplary embodiments are described and illustrated in the accompanying drawings in terms of functional blocks, units, and/or modules. Those skilled in the art will appreciate that, in some embodiments, these blocks, units, and/or modules may be physically implemented by, for example, electronic (or optical) circuits, such as, for example, logic circuits, discrete components, microprocessors, hard-wired circuits, memory elements, wiring connections, and the like, which may be formed using semiconductor-based fabrication techniques or other suitable manufacturing technologies. In some embodiments where the blocks, units, and/or modules are implemented by microprocessors or other similar hardware, they may be programmed and controlled using software (e.g., microcode) to perform various functions discussed herein and may optionally be driven by firmware and/or software. In some embodiments, each block, unit, and/or module may be implemented by dedicated hardware, or by a combination of dedicated hardware to perform some functions and a processor (e.g., one or more programmed microprocessors and associated circuitry) to perform other functions. In some embodiments, each block, unit, and/or module may be physically separated into two or more interacting and discrete blocks, units, and/or modules without departing from the scope of the present disclosure. In some embodiments, the blocks, units, and/or modules may be physically combined into more complex blocks, units, and/or modules without departing from the scope of the present disclosure.

Unless otherwise defined, all terms (including technical and scientific terms) used herein have the same or substantially the same meaning as commonly understood by one of ordinary skill in the art to which this disclosure is a part. Terms, such as, for example, those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a display device 10 according to an embodiment.

In the present specification, the terms "above," "top," "upper surface" and "upper end" indicate an upward direction from the display device 10, such as, for example, a Z-axis direction, and the terms "below," "bottom," "lower surface" and "lower end" indicate a downward direction from the display device 10, such as, for example, a direction opposite to the Z-axis direction. In addition, the terms "left," "right," "upper side" and "lower side" indicate directions when the display device 10 is viewed in plan view. For example, "left" indicates a direction opposite to an X-axis direction, "right" indicates the X-axis direction, "upper side" indicates a Y-axis direction, and "lower side" indicates a direction opposite to the Y-axis direction.

Referring to FIG. 1, the display device 10 is a device to display moving images or still images. The display device 10 may be used as a display screen in any suitable portable electronic device such as, for example, mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in any other suitable product such as, for example, televisions, notebook computers, monitors, billboards, and the Internet of things (IoT).

The display device 10 may include a first area DR1 and a second area DR2. The first area DR1 may be flat, and the second area DR2 may extend from right and left sides of the first area DR1. In some embodiments, the second area DR2 may be flat or curved. When the second area DR2 is flat, an angle between the first area DR1 and the second area DR2 may be an obtuse angle (e.g., an angle greater than 90 degrees). When the second area DR2 is curved, it may have a constant curvature or a varying curvature.

The second area DR2 may extend from each of the right and left sides of the first area DR1, but embodiments are not limited thereto. In some embodiments, the second area DR2 may extend from only one of the right and left sides of the first area DR1. In some embodiments, the second area DR2 may extend from the right and left sides of the first area DR1 and from at least any one of upper and lower sides of the first area DR1.

The display device 10 includes a display panel 100 that displays an image. The display panel 100 may include a display area DA and a non-display area NDA. The display area DA may include a first display area DA1 and a second display area DA2. The second display area DA2 may be at a side (e.g., at an upper side) of the first display area DA1. In some embodiments, the first and second display areas DA1 and DA2 may be in the first area DR1 and the second area DR2.

The display area DA is an area where an image may be displayed and may include a plurality of subpixels SP. In addition, the display area DA may include a detection member to detect an external environment. In some embodiments, the display area DA may include a fingerprint recognition area to recognize a user's fingerprint. Therefore, the display area DA may include a plurality of subpixels SP and a plurality of fingerprint sensors FPS. In some embodiments, the display area DA may display an image and may include an area to recognize a user's fingerprint. For example, the display panel 100 in which the subpixels SP are arranged and a fingerprint sensor layer FPSL in which the fingerprint sensors FPS are arranged may overlap in a third direction (Z-axis direction).

In some embodiments, the first display area DA1 may be a main display area including a plurality of subpixels SP. The second display area DA2 may include a pixel area including a plurality of subpixels SP and may include a transmissive area to transmit light. The second display area DA2 may include (e.g., may be) a sensor area having a smaller number of subpixels SP per unit area than the first display area DA1. As the area of the transmissive area of the second display area DA2 increases, the number of subpixels SP per unit area of the second display area DA2 may become smaller than the number of subpixels SP per unit area of the first display area DA1.

The non-display area NDA may be defined as an area of the display panel 100 excluding the first and second display areas DA1 and DA2. In some embodiments, the non-display area NDA may include a scan driver to transmit scan signals to scan lines, fan-out lines connecting data lines and a display driver (e.g., connecting data lines to a display driver), and pads connected to a circuit board.

In some embodiments, the non-display area NDA may be opaque. In some embodiments, the non-display area NDA may include a decorative layer having a pattern that may be shown to a user.

Figure 2:
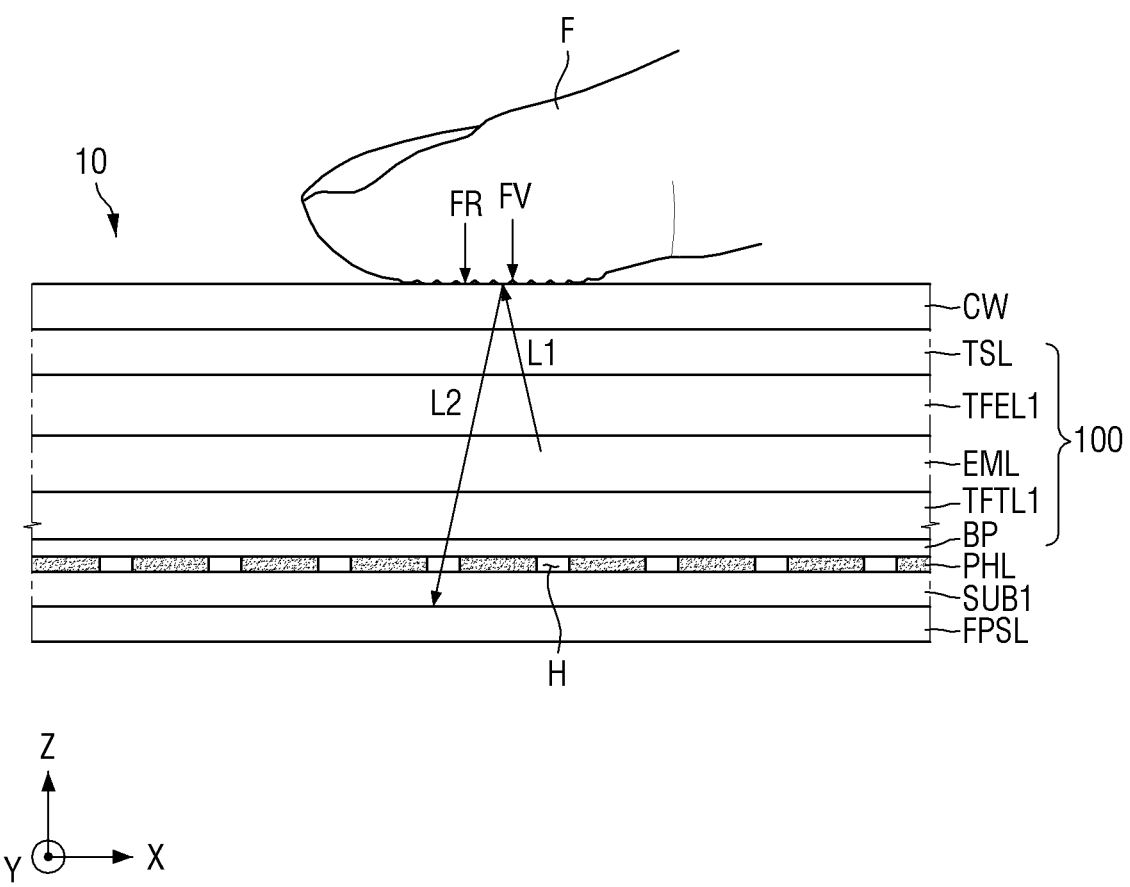
FIG. 2 is a cross-sectional view of the display device according to an embodiment.
Figure 3:
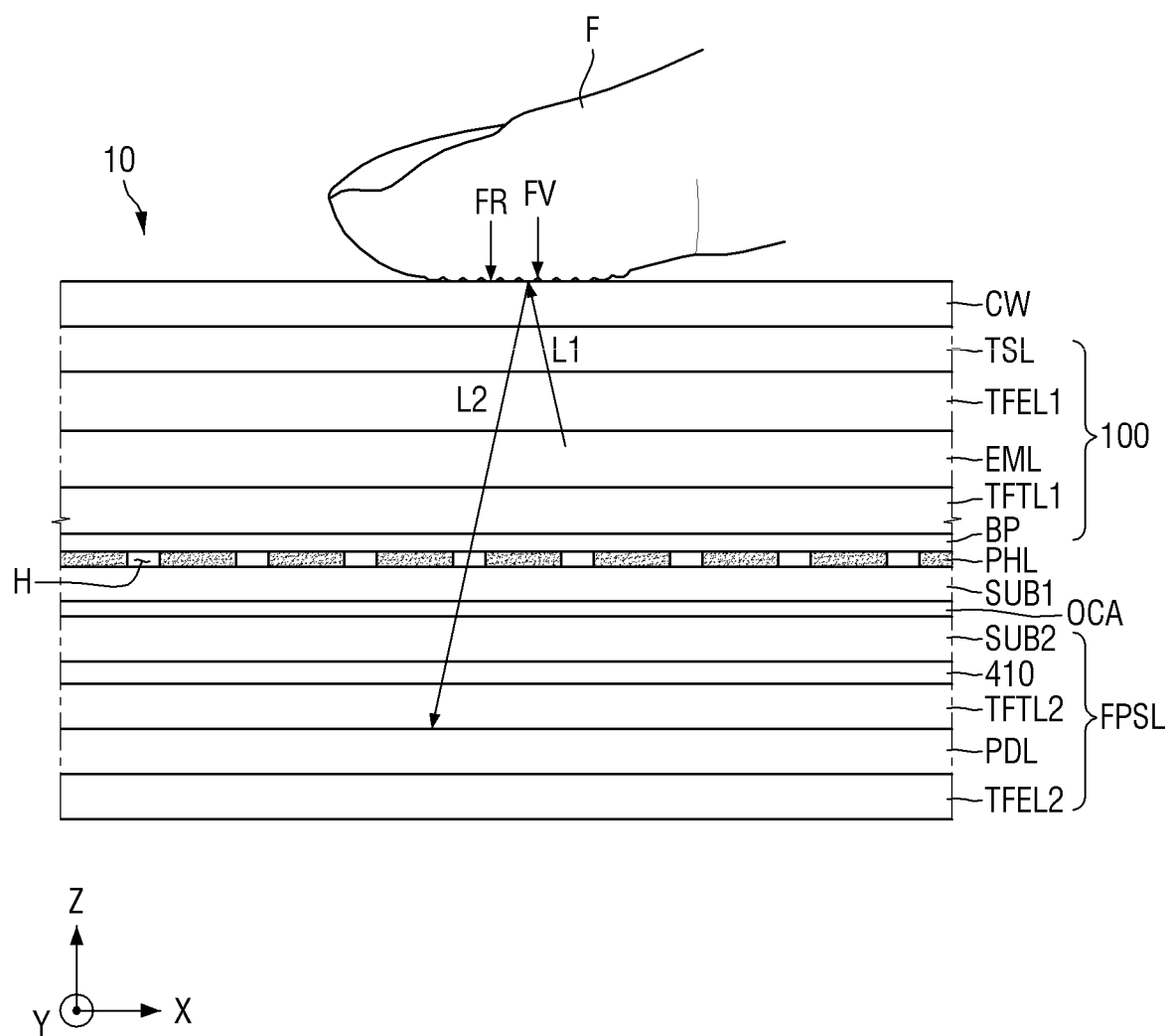
FIG. 3 is a cross-sectional view illustrating in more detail a fingerprint sensor layer in the display device of FIG. 2.

FIG. 2 is a cross-sectional view of the display device 10 according to an embodiment. FIG. 3 is a cross-sectional view illustrating in more detail a fingerprint sensor layer FPSL in the display device 10 of FIG. 2.

Referring to FIGS. 2 and 3, the display device 10 may include a first substrate SUB1, a light blocking layer PHL, the display panel 100, a cover window CW, and the fingerprint sensor layer FPSL. The display panel 100 may include a backplane BP, a first thin-film transistor layer TFTL1, a light emitting element layer EML, a first thin-film encapsulation layer TFEL1, and a touch sensor layer TSL.

The first substrate SUB1 may be a base substrate and may include an insulating material such as, for example, polymer resin. For example, the first substrate SUB1 may include polyethersulfone (PES), polyacrylate (PAC), polyarylate (PAR), polyetherimide (PEI), polyethylene naphthalate (PEN), polyethylene terepthalate (PET), polyphenylene sulfide (PPS), polyarylate (PAR), polyimide (PI), polycarbonate (PC), cellulose triacetate (CAT), cellulose acetate propionate (CAP), or any combination of the same.

In some embodiments, the first substrate SUB1 may be a rigid substrate. In some embodiments, the first substrate SUB1 may be a flexible substrate that can be bent, folded, and/or rolled. When the first substrate SUB1 is a flexible substrate, it may include polyimide (PI), but embodiments are not limited thereto.

The light blocking layer PHL may cover a lower surface of the first thin-film transistor layer TFTL1. The light blocking layer PHL may be between the first substrate SUB1 and the first thin-film transistor layer TFTL1 to block light from entering the first thin-film transistor layer TFTL1 and the light emitting element layer EML.

In some embodiments, the light blocking layer PHL may include a single layer or a multilayer including any one or more selected from molybdenum (Mo), aluminum (Al), chromium (Cr), gold (Au), titanium (Ti), nickel (Ni), neodymium (Nd), copper (Cu), and alloys of the same. In some embodiments, the light blocking layer PHL may include a black matrix and/or may include various suitable materials having light blocking properties.

The light blocking layer PHL may include a plurality of holes H. The holes H may be (e.g., may provide) optical passages through which second light L2 reflected by (e.g., from) the body of a user, after being output from the light emitting element layer EML as first light L1, travels toward the fingerprint recognition sensor layer FPSL. In some embodiments, each of the holes H may be a space surrounded by the first substrate SUB1, inner walls of the hole H of the light blocking layer PHL, and the backplane BP. In some embodiments, each of the holes H may include the same material included in the backplane BP. During some manufacturing processes of the display device 10, the holes H may be filled with the same material that is used to form the backplane BP during a process of forming the backplane BP on the light blocking layer PHL. In some embodiments, the holes H may be (e.g., may provide) optical passages through which the second light L2 reflected by the body of the user, after being output from the light emitting element layer EML as first light L1, travels toward the fingerprint recognition sensor layer FPSL.

In some embodiments, the holes H may not overlap a plurality of thin-film transistors of the first thin-film transistor layer TFTL1, and the light blocking layer PHL may overlap the thin-film transistors of the first thin-film transistor layer TFTL1. For example, the holes H may be arranged (e.g., arranged in lines) along a first direction (X-axis direction) and along a second direction (Y-axis direction). A size (e.g., an area) of each of the holes H may be determined by a path of the second light L2.

The backplane BP may be on the light blocking layer PHL and may support (e.g., may be under or directly under) the first thin-film transistor layer TFTL1. In some embodiments, the backplane BP may include an insulating material such as, for example, polymer resin.

In some embodiments, the backplane BP may be a rigid substrate. In some embodiments, the backplane BP may be a flexible substrate that can be bent, folded, and/or rolled. When the backplane BP is a flexible substrate, it may include polyimide (PI), but embodiments are not limited thereto.

The first thin-film transistor layer TFTL1 may be on the backplane BP. The first thin-film transistor layer TFTL1 may include one or more thin-film transistors for driving each of the subpixels SP. Each of the thin-film transistors of the subpixels SP may include a semiconductor layer, a gate electrode, a drain electrode, and a source electrode. In some embodiments, the first thin-film transistor layer TFTL1 may further include scan lines, data lines, power lines and scan control lines connected to the thin-film transistors of the subpixels SP and may further include routing lines connecting pads and the data lines (e.g., connecting pads to the data lines).

The light emitting element layer EML may be on the first thin-film transistor layer TFTL1. The light emitting element layer EML may include light emitting elements connected to the thin-film transistors of the first thin-film transistor layer TFTL1. Each of the light emitting elements may include a first electrode, a light emitting layer, and a second electrode. In some embodiments, the light emitting layer may include an organic light emitting layer including an organic material. When the light emitting layer includes an organic light emitting layer, if a thin-film transistor of the first thin-film transistor layer TFTL1 applies a predetermined or set voltage to the first electrode of a corresponding light emitting element, and the second electrode of the light emitting element receives a common voltage or a cathode voltage, then holes and electrons may move to the organic light emitting layer through a hole transport layer and through an electron transport layer, respectively, and combine together in the organic light emitting layer to emit light.

The light emitting element layer EML may include a pixel defining layer which defines the subpixels SP. The first electrodes and the light emitting layers of the light emitting elements may be spaced apart and insulated from each other by the pixel defining layer.

The first thin-film encapsulation layer TFEL1 may be on the light emitting element layer EML and may cover the first thin-film transistor layer TFTL1 and the light emitting element layer EML. The first thin-film encapsulation layer TFEL1 prevents or reduces the penetration of oxygen and/or moisture into the light emitting element layer EML. For example, the first thin-film encapsulation layer TFEL1 may include at least one inorganic layer. The first thin-film encapsulation layer TFEL1 may include an inorganic layer such as, for example, a silicon nitride layer, a silicon oxynitride layer, a silicon oxide layer, a titanium oxide layer, and/or an aluminum oxide layer, but embodiments are not limited thereto.

The first thin-film encapsulation layer TFEL1 may protect the light emitting element layer EML from foreign substances such as, for example, dust. For example, the first thin-film encapsulation layer TFEL1 may include at least one organic layer. The first thin-film encapsulation layer TFEL1 may include an organic layer such as, for example, acryl resin, epoxy resin, phenolic resin, polyamide resin, and/or polyimide resin, but embodiments are not limited thereto.

The touch sensor layer TSL may be on the first thin-film encapsulation layer TFEL1. When the touch sensor layer TSL is directly on the first thin-film encapsulation layer TFEL1, a thickness of the display device 10 can be reduced compared to when a separate touch panel including the touch sensor layer TSL is attached onto the first thin-film encapsulation layer TFEL1.

The touch sensor layer TSL may include touch electrodes for sensing a user's touch and touch electrode lines connecting pads and the touch electrodes (e.g., connecting pads to the touch electrodes). The touch electrodes of the touch sensor layer TSL may be in a touch sensing area that overlaps the display area DA of the display panel 100.

The cover window CW may be on the display panel 100. The cover window CW may be on the touch sensor layer TSL of the display panel 100. For example, the cover window CW may be attached onto the touch sensor layer TSL by a transparent adhesive member. In some embodiments, the cover window CW can be directly touched by a user's finger F.

The fingerprint sensor layer FPSL may be under the display panel 100. For example, the fingerprint sensor layer FPSL may be under the first substrate SUB1. An upper end (or one end, e.g., an upper surface) of the first substrate SUB1 may face the display panel 100 or the light blocking layer PHL, and a lower end (or the other end, e.g., a lower surface) of the first substrate SUB1 may face the fingerprint sensor layer FPSL. For example, an upper end (or one end, e.g., an upper surface) of the fingerprint sensor layer FPSL may be attached to the lower end (or the other end, e.g., the lower surface) of the first substrate SUB1 by a transparent adhesive member.

The fingerprint sensor layer FPSL may include the fingerprint sensors FPS illustrated in FIG. 1. The fingerprint sensors FPS may include optical fingerprint sensors. For example, the fingerprint sensors FPS may include photodiodes, complementary metal-oxide-semiconductor (CMOS) image sensors, charge-coupled device (CCD) cameras, phototransistors, and/or the like. The fingerprint sensors FPS may recognize (e.g., may be utilized by a sensor driver to recognize) a fingerprint by sensing light reflected by ridges FR of the finger F and valleys FV of the finger F between the ridges FR.

For example, when a user's finger F touches the cover window CW, the first light L1 output from the light emitting element layer EML is reflected by the ridges FR or the valleys FV of the finger F, and the reflected second light L2 passes through the holes H of the light blocking layer PHL to reach (e.g., to travel to) the fingerprint sensor layer FPSL under the first substrate SUB1. The fingerprint sensors FPS of the fingerprint sensor layer FPSL may recognize (e.g., may be utilized by a sensor driver to recognize) the user's fingerprint pattern by distinguishing between the second light L2 reflected by the ridges FR of the finger F and the second light L2 reflected by the valleys FV of the finger F. Therefore, the holes H of the light blocking layer PHL may be (e.g., may provide) passages for the second light L2 reflected by the user's finger F.

In some embodiments, because the fingerprint sensor layer FPSL is under the display panel 100, the process (e.g., the manufacturing process) can be simplified. In addition, because the fingerprint sensors FPS are not in a path along which the first light L1 is output (e.g., the fingerprint sensors FPS are not above the light emitting element layer EML), a reduction in resolution can be prevented or reduced.

The fingerprint sensor layer FPSL may include a second substrate SUB2, a buffer layer 410, a second thin-film transistor layer TFTL2, a light receiving element layer PDL, and a second thin-film encapsulation layer TFEL2.

The second substrate SUB2 may be on (e.g., attached to) a bottom (e.g., a lower surface) of the first substrate SUB1 by an adhesive member OCA. An upper end (or one end, e.g., an upper surface) of the second substrate SUB2 may face the lower end (or the other end, e.g., the lower surface) of the first substrate SUB1. In some embodiments, the adhesive member OCA may be an optical clear adhesive. The upper end (or one end, e.g., the upper surface) of the second substrate SUB2 may be attached to the lower end (or the other end, e.g., the lower surface) of the first substrate SUB1 by the adhesive member OCA.

The second substrate SUB2 may be a base substrate and may include an insulating material such as, for example, polymer resin. In some embodiments, the second substrate SUB2 may be a rigid substrate. In some embodiments, the second substrate SUB2 may be a flexible substrate that can be bent, folded, and/or rolled. When the second substrate SUB2 is a flexible substrate, it may include polyimide (PI), but embodiments are not limited thereto.

The buffer layer 410 may be at a lower end (or a second end, e.g., a lower surface) of the second substrate SUB2. The buffer layer 410 may include an inorganic layer that can prevent or reduce permeation or penetration of air and/or moisture. In some embodiments, the buffer layer 410 may include a plurality of inorganic layers stacked alternately. The buffer layer 410 may include, a multilayer in which one or more inorganic layers selected from a silicon nitride layer, a silicon oxynitride layer, a silicon oxide layer, a titanium oxide layer, and an aluminum oxide layer are alternately stacked, but embodiments are not limited thereto.

The second thin-film transistor layer TFTL2 may be at (e.g., on) the lower end (or the second end, e.g., the lower surface) of the second substrate SUB2 or the buffer layer 410. An upper end (or one end, e.g., an upper surface) of the second thin-film transistor layer TFTL2 may face the lower end (or the other end, e.g., the lower surface) of the buffer layer 410. The second thin-film transistor layer TFTL2 may include one or more thin-film transistors for driving each of the fingerprint sensors FPS. Each of the thin-film transistors of the fingerprint sensors FPS may include a semiconductor layer, a gate electrode, a drain electrode, and a source electrode. In some embodiments, the second thin-film transistor layer TFTL2 may further include scan lines, readout lines, and common voltage lines connected to the thin-film transistors of the fingerprint sensors FPS.

The light receiving element layer PDL may be at a lower end (or a second end, e.g., a lower surface) of the second thin-film transistor layer TFTL2. An upper end (or one end, e.g., an upper surface) of the light receiving element layer PDL may face the lower end (or the other end, e.g., the lower surface) of the second thin-film transistor layer TFTL2. The light receiving element layer PDL may include light receiving elements connected to the thin-film transistors of the second thin-film transistor layer TFTL2. Each of the light receiving elements may include a first electrode, a light receiving layer, and a second electrode. In some embodiments, the light receiving layer may be an organic light receiving layer including an organic material. When the light receiving layer is an organic light receiving layer, the organic light receiving layer may combine holes and electrons by receiving the second light L2 and converting the energy of the second light L2 into an electrical signal (current or voltage) between the first electrode and the second electrode.

The light receiving element layer PDL may include a sensor defining layer that defines the fingerprint sensors FPS. The first electrodes and the light receiving layers of the light receiving elements may be spaced apart and insulated from each other by the sensor defining layer.

The second thin-film encapsulation layer TFEL2 may be at a lower end (or a second end, e.g., a lower surface) of the light receiving element layer PDL. An upper end (or one end, e.g., an upper surface) of the second thin-film encapsulation layer TFEL2 may face the lower end (or the other end, e.g., the lower surface) of the light receiving element layer PDL. The second thin-film encapsulation layer TFEL2 may cover a lower surface of the light receiving element layer PDL and may prevent or reduce the penetration of oxygen and/or moisture into the light receiving element layer PDL. For example, the second thin-film encapsulation layer TFEL2 may include at least one inorganic layer. The second thin-film encapsulation layer TFEL2 may include an inorganic layer such as, for example, a silicon nitride layer, a silicon oxynitride layer, a silicon oxide layer, a titanium oxide layer, and/or an aluminum oxide layer, but embodiments are not limited thereto.

The second thin-film encapsulation layer TFEL2 may protect the light receiving element layer PDL from foreign substances such as, for example, dust. For example, the second thin-film encapsulation layer TFEL2 may include at least one organic layer. The second thin-film encapsulation layer TFEL2 may include an organic layer such as, for example, acryl resin, epoxy resin, phenolic resin, polyamide resin, and/or polyimide resin, but embodiments are not limited thereto.

Figure 4:
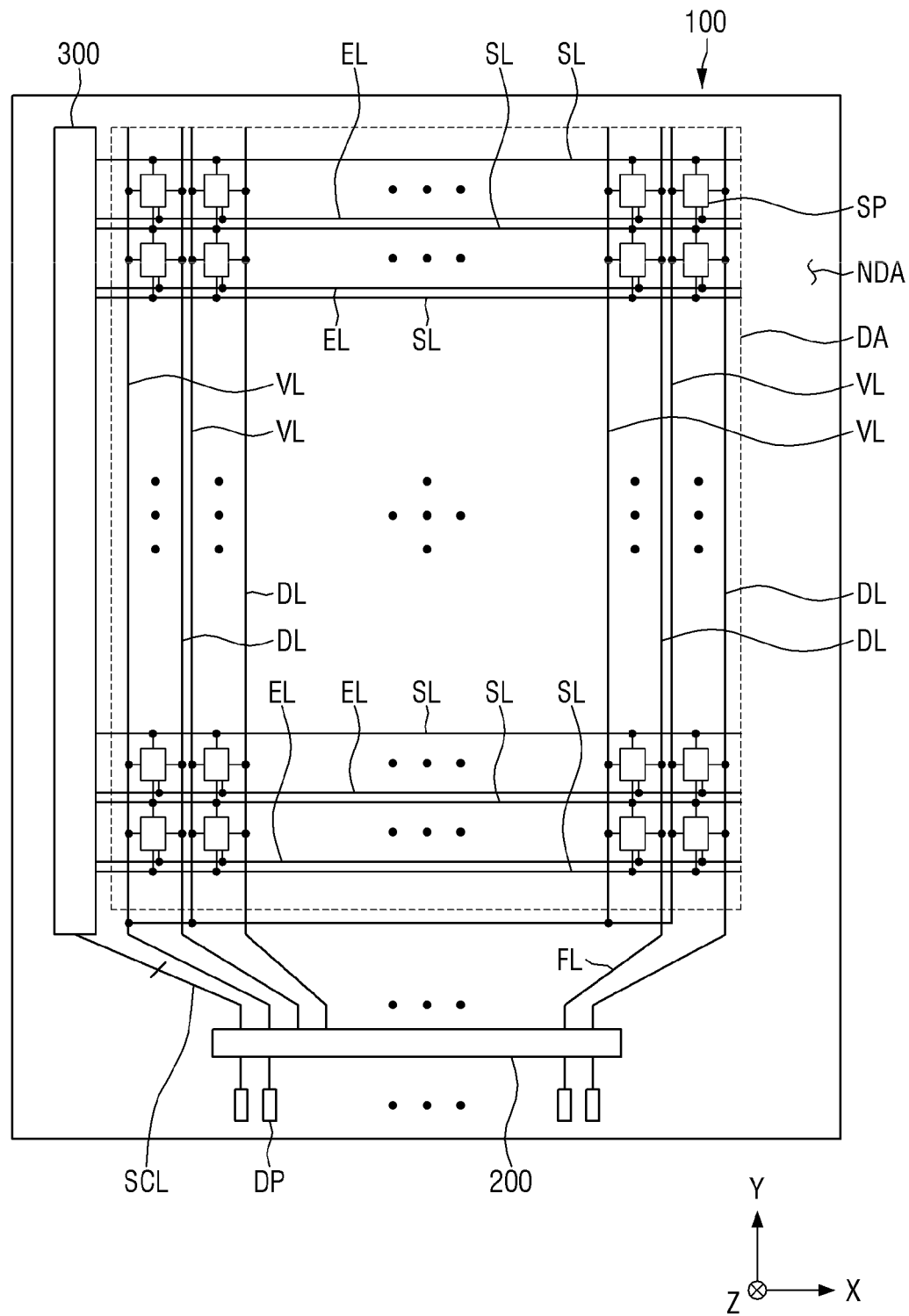
FIG. 4 illustrates the connection relationship between subpixels and lines of the display device according to an embodiment.

FIG. 4 illustrates the connection relationship between the subpixels SP and lines of the display device 10 according to an embodiment.

Referring to FIG. 4, the display panel 100 may include the display area DA and the non-display area NDA.

The display area DA may include a plurality of subpixels SP and a plurality of voltage supply lines VL, scan lines SL, emission lines EL and data lines DL connected to the subpixels SP.

Each of the subpixels SP may be connected to at least one scan line SL, at least one data line DL, at least one emission line EL, and at least one voltage supply line VL. In the embodiment illustrated in FIG. 4, each of the subpixels SP may be connected to two scan lines SL, one data line DL, one emission line EL, and one voltage supply line VL. However, embodiments are not limited thereto. For example, each of the subpixels SP may be connected to three or more scan lines SL.

Each of the subpixels SP may include a driving transistor, one or more switching transistors, a light emitting element, and a capacitor. The driving transistor may supply a driving current to the light emitting element according to a data voltage applied to a gate electrode, thereby causing the light emitting element to emit light. In some embodiments, the driving transistor and the switching transistors may be thin-film transistors. The light emitting element may emit light of a predetermined or set luminance level according to the magnitude of the driving current of the driving transistor. In some embodiments, the light emitting element may be an organic light emitting diode (OLED) including a first electrode, an organic light emitting layer, and a second electrode. The capacitor may keep the data voltage applied to the gate electrode of the driving transistor constant.

The subpixels SP may receive a driving voltage VDD through the voltage supply lines VL. In some embodiments, the driving voltage VDD may be a high-potential voltage for driving the light emitting element of each of the subpixels SP.

The voltage supply lines VL may be spaced apart from each other in the first direction (X-axis direction) and may extend in the second direction (Y-axis direction). For example, the voltage supply lines VL may be along (e.g., may be arranged along) columns of the subpixels SP in the display area DA. Each of the voltage supply lines VL may be connected to subpixels SP arranged in the same column of pixels that it is along and may supply the driving voltage VDD to the subpixels SP.

The scan lines SL and the emission lines EL may extend in the first direction (X-axis direction) and may be spaced apart from each other in the second direction (Y-axis direction) intersecting the first direction (X-axis direction). The scan lines SL and the emission lines EL may be parallel (e.g., substantially parallel) to each other.

The data lines DL may be spaced apart from each other in the first direction (X-axis direction) and extend in the second direction (Y-axis direction). The data lines DL may be parallel (e.g., substantially parallel) to the voltage supply lines VL. The non-display area NDA may be defined as an area of the display panel 100 excluding the display area DA. The non-display area NDA may include a scan driver 300 for transmitting scan signals to the scan lines SL, fan-out lines FL connecting the data lines DL and a display driver 200 (e.g., connecting the data lines DL to the display driver 200), and pads DP connected to a circuit board. The pads DP may be closer to an edge (e.g., closer to the lower side) of the display panel 100 than the display driver 200.

The display driver 200 may be connected to the pads DP and may receive digital video data and timing signals (e.g., from the circuit board). The display driver 200 may convert the digital video data into analog positive/negative data voltages and output the analog positive/negative data voltages to the data lines DL through the fan-out lines FL.

In some embodiments, the display driver 200 may include (e.g., may be) an integrated circuit and may be attached onto the first substrate SUB1 using a chip-on-glass (COG) method, a chip-on-plastic (COP) method, or an ultrasonic bonding method.

The display driver 200 may generate a scan control signal and supply the scan control signal to the scan driver 300 through scan control lines SCL.

The scan driver 300 may be at a side (e.g., the left side) of the non-display area NDA. The scan driver 300 may include a plurality of thin-film transistors to generate scan signals according to the scan control signal. The scan driver 300 may select subpixels SP to be supplied with data voltages by supplying the scan signals to the subpixels SP based on the scan control signal.

Figure 5:
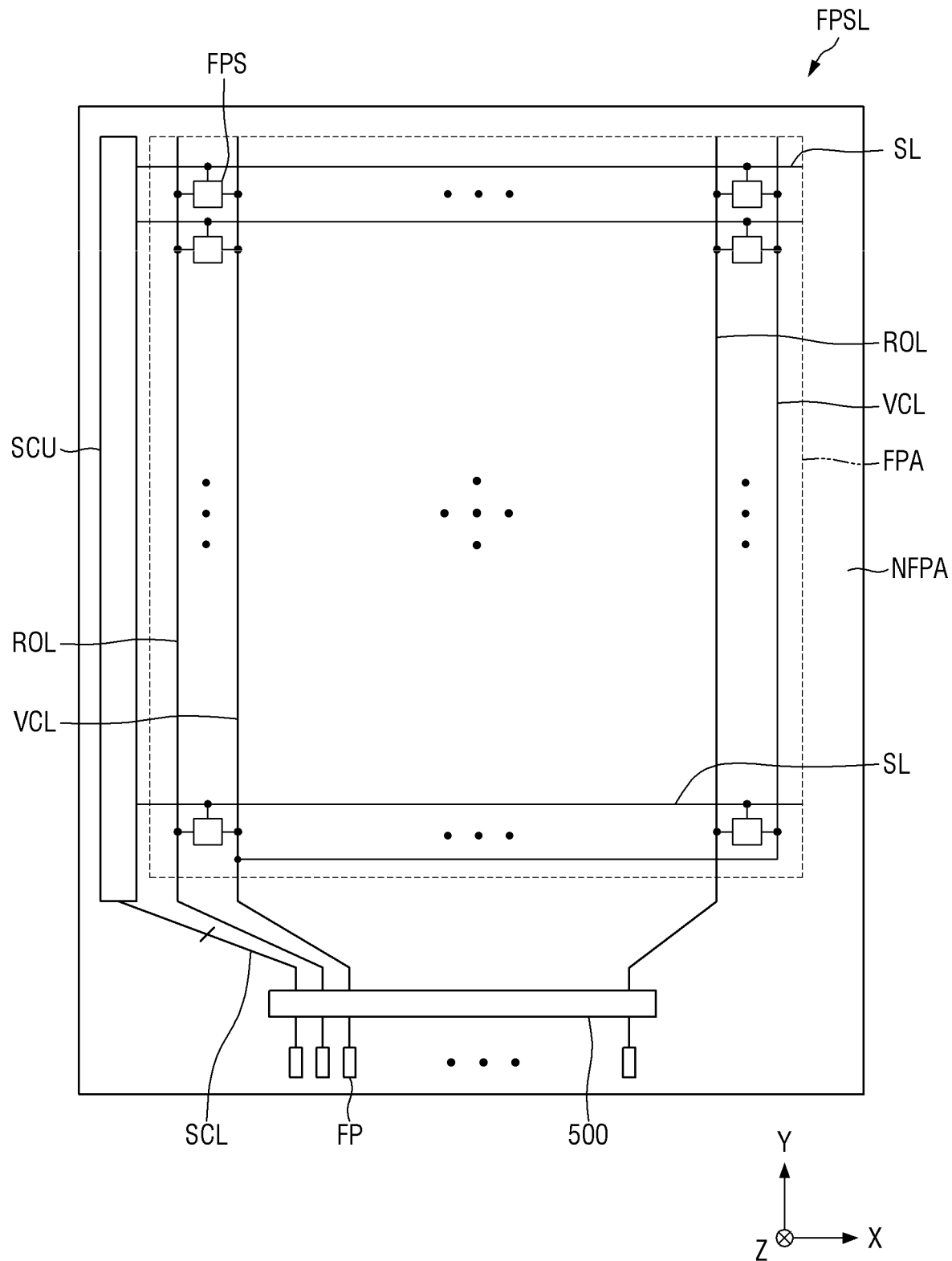
FIG. 5 illustrates the connection relationship between fingerprint sensors and lines of the display device according to an embodiment.
Figure 6:
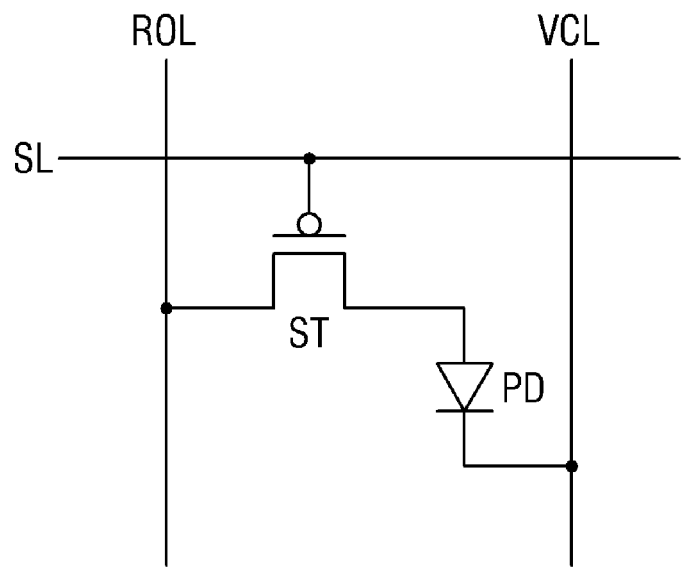
FIG. 6 is a circuit diagram illustrating a switching transistor and a fingerprint sensor of the display device according to an embodiment.

FIG. 5 illustrates the connection relationship between the fingerprint sensors FPS and lines of the display device 10 according to an embodiment. FIG. 6 is a circuit diagram illustrating a switching transistor ST and a fingerprint sensor FPS of the display device 10 according to an embodiment.

Referring to FIGS. 5 and 6, the fingerprint sensor layer FPSL may include a fingerprint recognition area FPA and a non-fingerprint recognition area NFPA.

The fingerprint recognition area FPA may include a plurality of fingerprint sensors FPS and a plurality of scan lines SL, a plurality of readout lines ROL and a plurality of common voltage lines VCL connected to the fingerprint sensors FPS. In some embodiments, a distance between the fingerprint sensors FPS may be about 5 μm to about 50 μm. One fingerprint pixel of the cover window CW may correspond to about twenty to about thirty fingerprint sensors FPS of the fingerprint sensor layer FPSL, but embodiments are not limited thereto.

The fingerprint sensors FPS may be connected to a scan driver SCU by the scan lines SL and may receive scan signals from the scan driver SCU. The scan lines SL may extend in the first direction (X-axis direction) and may be spaced apart from each other in the second direction (Y-axis direction). The scan driver SCU may select fingerprint sensors FPS which will sense changes in readout signals by supplying a scan signal to each of the fingerprint sensors FPS.

The fingerprint sensors FPS may be connected to a sensor driver 500 by the readout lines ROL and may supply readout signals to the sensor driver 500. The readout lines ROL may be spaced apart from each other in the first direction (X-axis direction) and may extend in the second direction (Y-axis direction).

The non-fingerprint recognition area NFPA may be outside the fingerprint recognition area FPA. The non-fingerprint recognition area NFPA may be defined as an area other than the fingerprint recognition area FPA. In some embodiments, the scan driver SCU may be at a side (e.g., a left side) of the non-fingerprint recognition area NFPA and may be connected to the scan lines SL extending to the fingerprint recognition area FPA.

The sensor driver 500 may be at another side perpendicular (e.g., substantially perpendicular) to the side of the non-fingerprint recognition area NFPA that the scan driver SCU is at, and may be connected to the readout lines ROL extending to the fingerprint recognition area FPA. For example, in some embodiments where the scan driver SCU is at the left side of the non-finger print recognition area NFPA, the sensor driver 500 may be at a lower side of the non-finger print recognition area NFPA. The sensor driver 500 may supply sensing driving voltages to the fingerprint sensors FPS and may recognize a user's fingerprint pattern by receiving readout signals generated in response to a touch of the user's finger F.

For example, when the user's finger F touches the cover window CW, readout signals of fingerprint sensors FPS, which receive scan signals, may be changed. Readout signals of fingerprint sensors FPS, which receive light reflected by the ridges FR of the finger F, may be different from readout signals of fingerprint sensors FPS that receive light reflected by the valleys FV of the finger F. The sensor driver 500 may distinguish between these readout signals to determine whether the ridges FR of the finger F or the valleys FV of the finger F have touched a fingerprint pixel of the cover window CW, which corresponds to the fingerprint sensors FPS. Therefore, the sensor driver 500 may recognize the user's fingerprint pattern based on the readout signals.

The non-fingerprint recognition area NFPA may further include fingerprint recognition pads FP at (e.g., near) an edge (e.g., the edge of the lower side) of the fingerprint sensor layer FPSL. The fingerprint recognition pads FP may be connected to the sensor driver 500 and may supply signals received from an external integrated circuit to the sensor driver 500.

In FIG. 6, a fingerprint sensor FPS may include a switching transistor ST and a light receiving element PD.

The switching transistor ST may supply a sensing driving voltage to the light receiving element PD based on a scan signal transmitted to a gate electrode. In some embodiments, the switching transistor ST may have the gate electrode connected to a scan line SL, a first electrode connected to a readout line ROL, and a second electrode connected to a first electrode of the light receiving element PD. The first electrode of the switching transistor ST may be a source electrode, and the second electrode of the switching transistor ST may be a drain electrode. When a source-gate voltage Vsg of the switching transistor ST exceeds a threshold voltage Vth of the switching transistor ST, a driving current may flow through a channel of the switching transistor ST.

The light receiving element PD may recognize (e.g., may be utilized by the sensor driver 500 to recognize) the user's fingerprint pattern based on the second light L2 reflected by the user's finger F. The first electrode of the light receiving element PD may be connected to the second electrode of the switching transistor ST, and a second electrode of the light receiving element PD may be connected to a common voltage line VCL. In some embodiments, the second electrodes of a plurality of light receiving elements PD may be a common electrode and may be connected to the common voltage line VCL. The common voltage line VCL may supply a low-potential voltage to the second electrode of the light receiving element PD.

The light receiving element PD may not receive light when the user makes no body contact (e.g., no physical contact) with the cover window CW. When the light receiving element PD does not receive light, it may output a driving current, input to the first electrode, to the second electrode. For example, when the light receiving element PD does not receive light, a driving current may be input to the first electrode and may be output from the second electrode.

When the user's finger F touches the cover window CW, the light receiving element PD may receive the second light L2 reflected by a ridge FR or a valley FV of the finger F. The first light L1 output from the light emitting element layer EML may be reflected by the ridge FR or by the valley FV of the finger F, and the reflected second light L2 may reach (e.g., may travel to) the light receiving element PD of the fingerprint sensor layer FPSL. The light receiving element PD may convert the energy of the second light L2 into an electrical signal (current or voltage) between the first electrode and the second electrode of the light receiving element PD, and the electrical signal may be supplied to the sensor driver 500 as a readout signal. For example, when a reverse bias is formed at the first electrode and the second electrode of the light receiving element PD, a current in a reverse direction to the driving current may flow in proportion to the amount of the received second light L2. Therefore, when the light receiving element PD receives the second light L2, the reverse current output from the light receiving element PD may flow to the switching transistor ST and may be applied to the sensor driver 500 as a readout signal.

The sensor driver 500 may recognize the user's fingerprint pattern by distinguishing whether the readout signals received from the fingerprint sensors FPS corresponds to the ridge FR of the finger F or the valley FV of the finger F.

In some embodiments, the light receiving element PD may include (e.g., may function as, or may be implemented as) a phototransistor or a photodiode. In some embodiments, the light receiving element PD may include an optical sensor that converts light energy into electrical energy and may use a photovoltaic effect in which an electric current changes according to the intensity of light.

Figure 7:
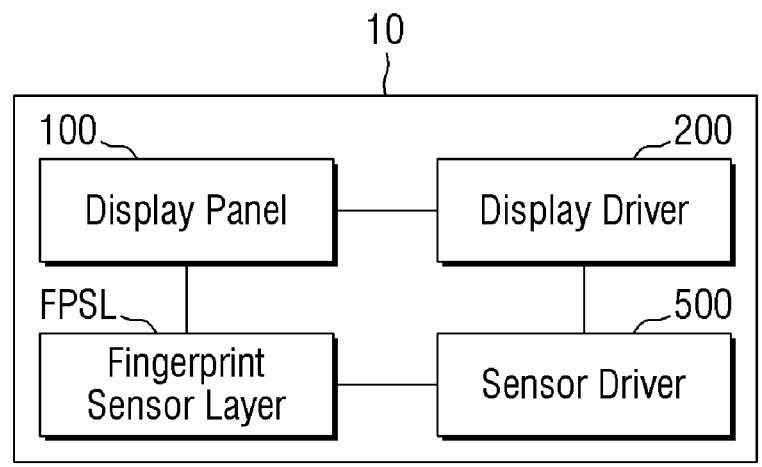
FIG. 7 is a block diagram of the display device according to an embodiment.

FIG. 7 is a block diagram of the display device 10 according to an embodiment.

Referring to FIG. 7, the display device 10 may include the display panel 100, the display driver 200, the fingerprint sensor layer FPSL, and the sensor driver 500.

The display driver 200 may control an image display operation of the display panel 100 by supplying image driving signals to the display panel 100. The display driver 200 may generate image driving signals based on digital video data and timing signals received from an external source. For example, the display driver 200 may receive the digital video data and the timing signals from a host, and the timing signals may include a vertical synchronization signal, a horizontal synchronization signal and a main clock signal. In addition, the image driving signals may include scan signals, emission signals, and data signals.

The sensor driver 500 may recognize a user's fingerprint by controlling the operation of the fingerprint sensors FPS of the fingerprint sensor layer FPSL. For example, the sensor driver 500 may supply sensing driving voltages to the fingerprint sensors FPS and receive readout signals generated in response to a touch of the user's finger F. The fingerprint sensors FPS may supply different readout signals to the sensor driver 500 based on the energy of light reflected by each of the ridges FR and the valleys FV of the finger F and received by the fingerprint sensors FPS. The sensor driver 500 may recognize the user's fingerprint based on the readout signals respectively corresponding to a plurality of fingerprint pixels of the cover window CW.

In some embodiments, the display driver 200 and the sensor driver 500 may be integrated into a single element. In some embodiments, the display driver 200 and the sensor driver 500 may be implemented as a single integrated circuit, but embodiments are not limited thereto.

Figure 8:
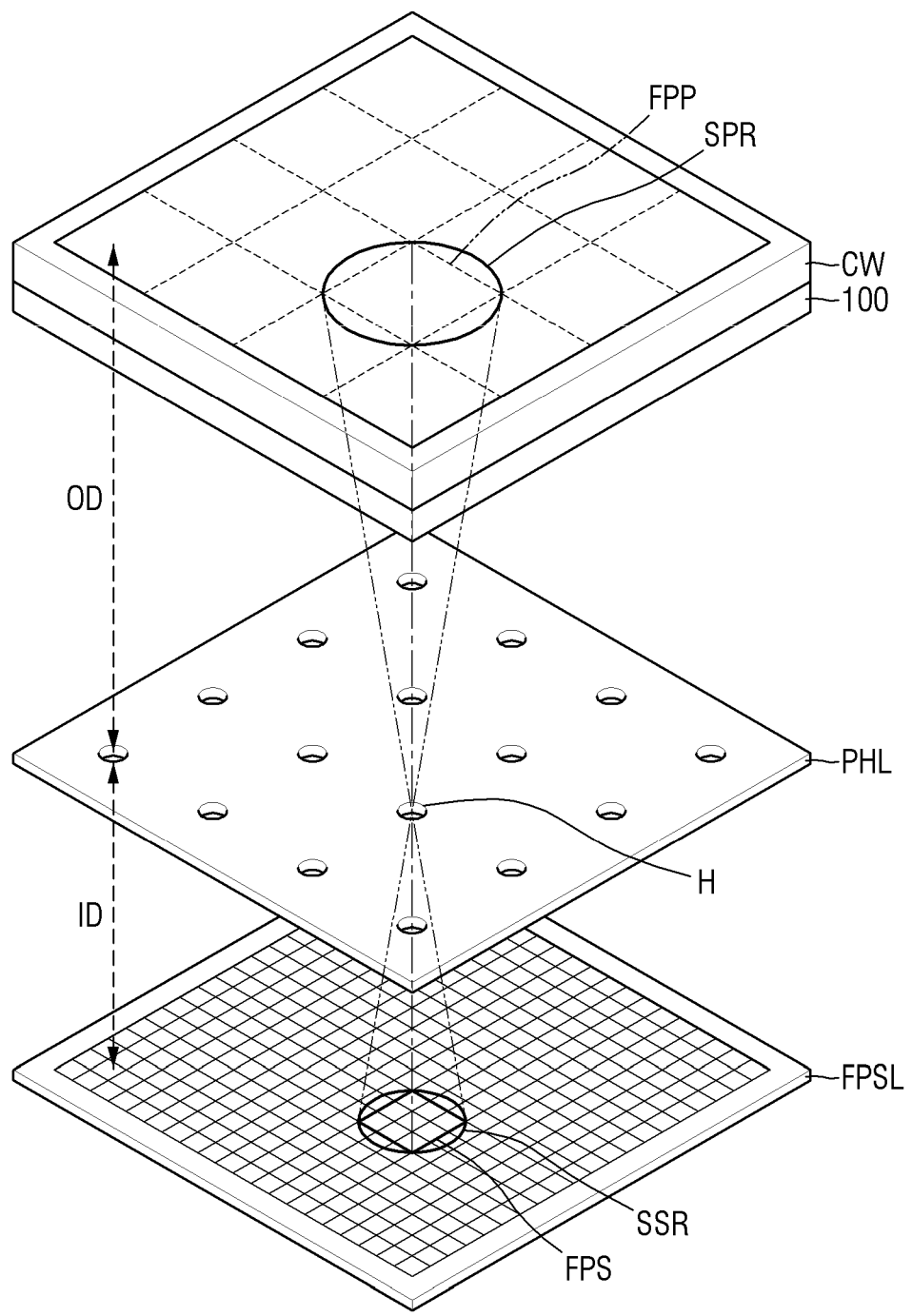
FIG. 8 is a perspective view illustrating paths of reflected light in the display device according to an embodiment.
Figure 9:
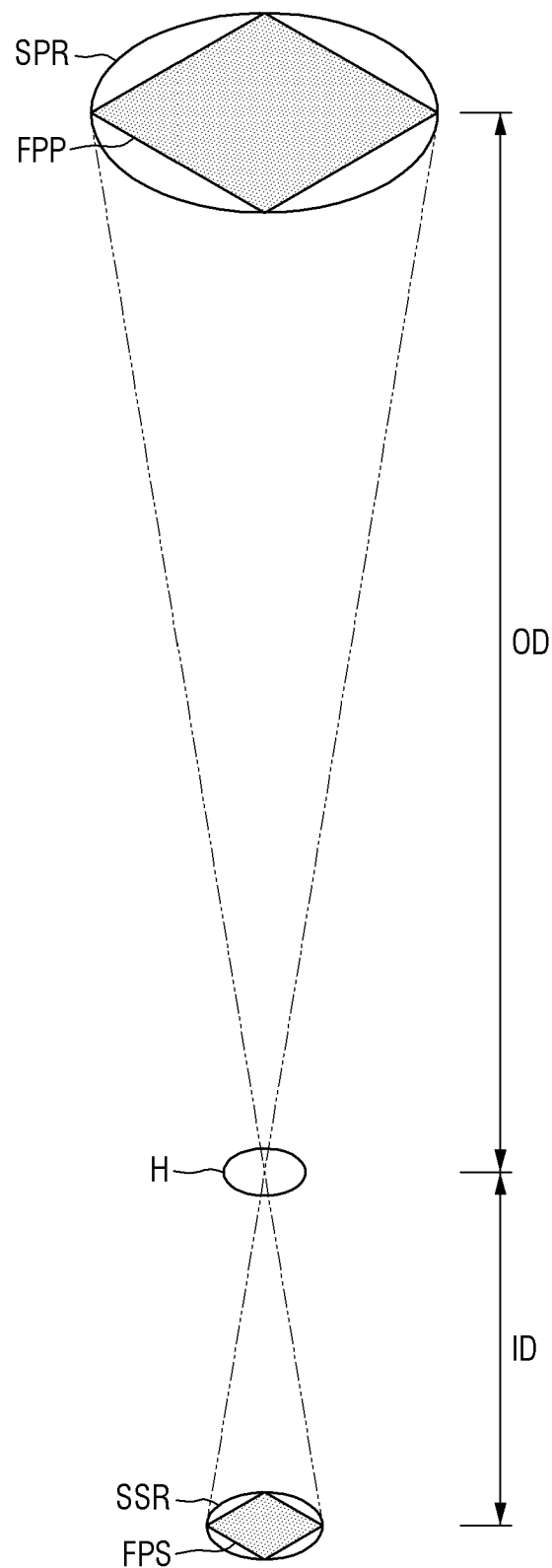
FIG. 9 illustrates a fingerprint pixel and a sensor pixel of the display device according to an embodiment.

FIG. 8 is a perspective view illustrating paths of reflected light in the display device 10 according to an embodiment. FIG. 9 illustrates a fingerprint pixel FPP and a fingerprint sensor FPS of the display device 10 according to an embodiment.

Referring to FIGS. 8 and 9, the display device 10 may include the cover window CW, the display panel 100, the light blocking layer PHL, and the fingerprint sensor layer FPSL.

The cover window CW may include a plurality of fingerprint pixels FPP and a sampling area SPR surrounding each of the fingerprint pixels FPP. The fingerprint sensor layer FPSL may include a plurality of fingerprint sensors FPS and a sensing area SSR surrounding each group of the fingerprint sensors FPS.

One fingerprint pixel FPP of the cover window CW may correspond to at least one fingerprint sensor FPS (e.g., to a group of fingerprint sensors FPS) of the fingerprint sensor layer FPSL. In some embodiments, one fingerprint pixel FPP may correspond to a group of about twenty to about thirty fingerprint sensors FPS. The sampling areas SPR of the cover window CW may correspond to the sensing areas SSR of the fingerprint sensor layer FPSL.

Each of the fingerprint pixels FPP may correspond to one hole H of the light blocking layer PHL. For example, when a user's finger F touches the cover window CW, each of the sampling areas SPR may reflect the first light L1 output from the display panel 100 (e.g., output from the light emitting layer EML), and the second light L2 reflected by each of the sampling areas SPR may pass through a hole H of the light blocking layer PHL to reach (e.g., to travel to) a sensing area SSR of the fingerprint sensor layer FPSL. The holes H of the light blocking layer PHL may serve as passages for the second light L2 reflected by the user's finger F. Therefore, the fingerprint sensors FPS may sense the second light L2 reflected by the ridges FR of the finger F touching a sampling area SPR of the cover window CW and the valleys FV between the ridges FR.

The fingerprint sensors FPS may generate readout signals by sensing the second light L2 reflected by the ridges FR or the valleys FV of the finger F and may supply the readout signals to the sensor driver 500. The sensor driver 500 may distinguish readout signals corresponding to the ridges FR of the finger F from readout signals corresponding to the valleys FV of the finger F. Therefore, the sensor driver 500 may recognize a fingerprint pattern of the finger F touching a sampling area SPR by combining the respective readout signals of the fingerprint sensors FPS.

The display device 10 may sense light reflected by the user's finger F through the fingerprint sensors FPS by adjusting a ratio of a fingerprint distance OD to a sensor distance ID. In some embodiments, the fingerprint distance OD may be a distance between a surface of the cover window CW that the user's finger F directly touches and a center point of a hole H of the light blocking layer PHL. The sensor distance ID may be a distance between the center point of the hole H of the light blocking layer PHL and a fingerprint sensor FPS of the fingerprint sensor layer FPSL. In some embodiments, light reflected by one end (e.g., one side) of a fingerprint pixel FPP of the cover window CW may pass through a center point of a hole H to reach (e.g., to travel to) the other end (e.g., the other side) of a group of fingerprint sensors FPS. In addition, light reflected by the other end (e.g., the other side) of the fingerprint pixel FPP of the cover window CW may pass through the center point of the hole H to reach (e.g., to travel to) one end (e.g., one side) of the group of the fingerprint sensors FPS. In some such embodiments, the one end (e.g., one side) of the finger print pixel FPP may correspond to the one end (e.g., one side) of the group of the fingerprint sensors FPS, and the other end (e.g., the other side) of the fingerprint pixel FPP may correspond to the other end (e.g., the other side) of the group of fingerprint sensors FPS. Therefore, the shape of a fingerprint directly contacting the fingerprint pixel FPP may be 180 degrees different from an image of the fingerprint formed on the group of the fingerprint sensors FPS. The display device 10 may improve the sensitivity of the fingerprint sensors FPS by adjusting the ratio of the fingerprint distance OD to the sensor distance ID and by adjusting the arrangement and shape of the holes H of the light blocking layer PHL.

Figure 10:
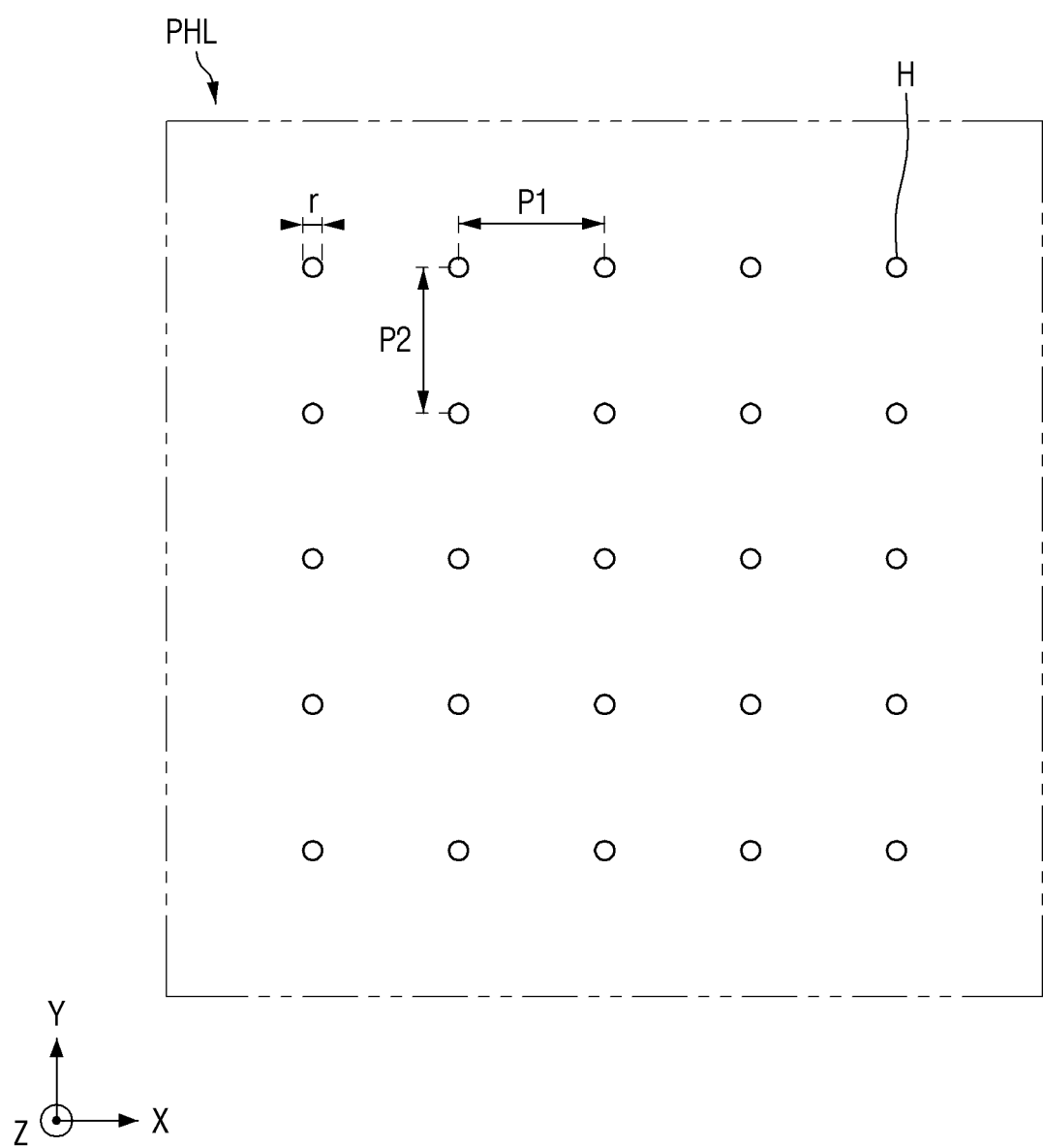
FIG. 10 is a plan view of an example of a light blocking layer of the display device according to an embodiment.

FIG. 10 is a plan view of an example of the light blocking layer PHL of the display device 10 according to an embodiment.

Referring to FIG. 10, the light blocking layer PHL may include a plurality of holes H. In some embodiments, the holes H may be circular in plan view. Each of the holes H may have a diameter r of, about 3 μm to about 20 μm, but embodiments are not limited thereto.

The holes H may be arranged with a first pitch P1 in the first direction (X-axis direction). In some embodiments, the first pitch P1 may be about 1.3 to about 1.5 times the sensor distance ID. In some embodiments, the first pitch P1 may be about 1.3 times the sensor distance ID. In some embodiments, the sensor distance ID may be a distance between a center point of a hole H of the light blocking layer PHL and a fingerprint sensor FPS of the fingerprint sensor layer FPSL.

The holes H may be arranged with a second pitch P2 in the second direction (Y-axis direction). In some embodiments, the second pitch P2 may be the same as the first pitch P1. In some embodiments, the second pitch P2 may be different from the first pitch P1.

In some embodiments, the holes H may be arranged (e.g., arranged in lines) parallel (e.g., substantially parallel) to each other in the first direction (X-axis direction) and in the second direction (Y-axis direction). In some embodiments, the holes H may be arranged with the first pitch P1 and the second pitch P2 but may be aligned along directions other than the first direction (X-axis direction) and the second direction (Y-axis direction).

In some embodiments, the first pitch P1 or the second pitch P2 may be proportional to a thickness of the first thin-film encapsulation layer TFEL1. As the thickness of the first thin-film encapsulation layer TFEL1 increases, the fingerprint distance OD may increase, and the area of each of the fingerprint pixels FPP and the sampling areas SPR may increase. Therefore, the first pitch P1 or the second pitch P2 of the holes H may be proportional to the thickness of the first thin-film encapsulation layer TFEL1 in order to adjust the ratio of the fingerprint distance OD to the sensor distance ID.

In some embodiments, the first pitch P1 or the second pitch P2 may be proportional to a distance between the light emitting elements (e.g., between adjacent light emitting elements) of the light emitting element layer EML or to a distance between the subpixels SP (e.g., between adjacent subpixels SP). As the distance between the light emitting elements increases, a distance between portions of the second light L2 reflected by the finger F may also increase. Therefore, the first pitch P1 or the second pitch P2 may be proportional to the distance between the light emitting elements or to the distance between the subpixels SP so that the holes H can serve as passages for the second light L2.

Figure 11:
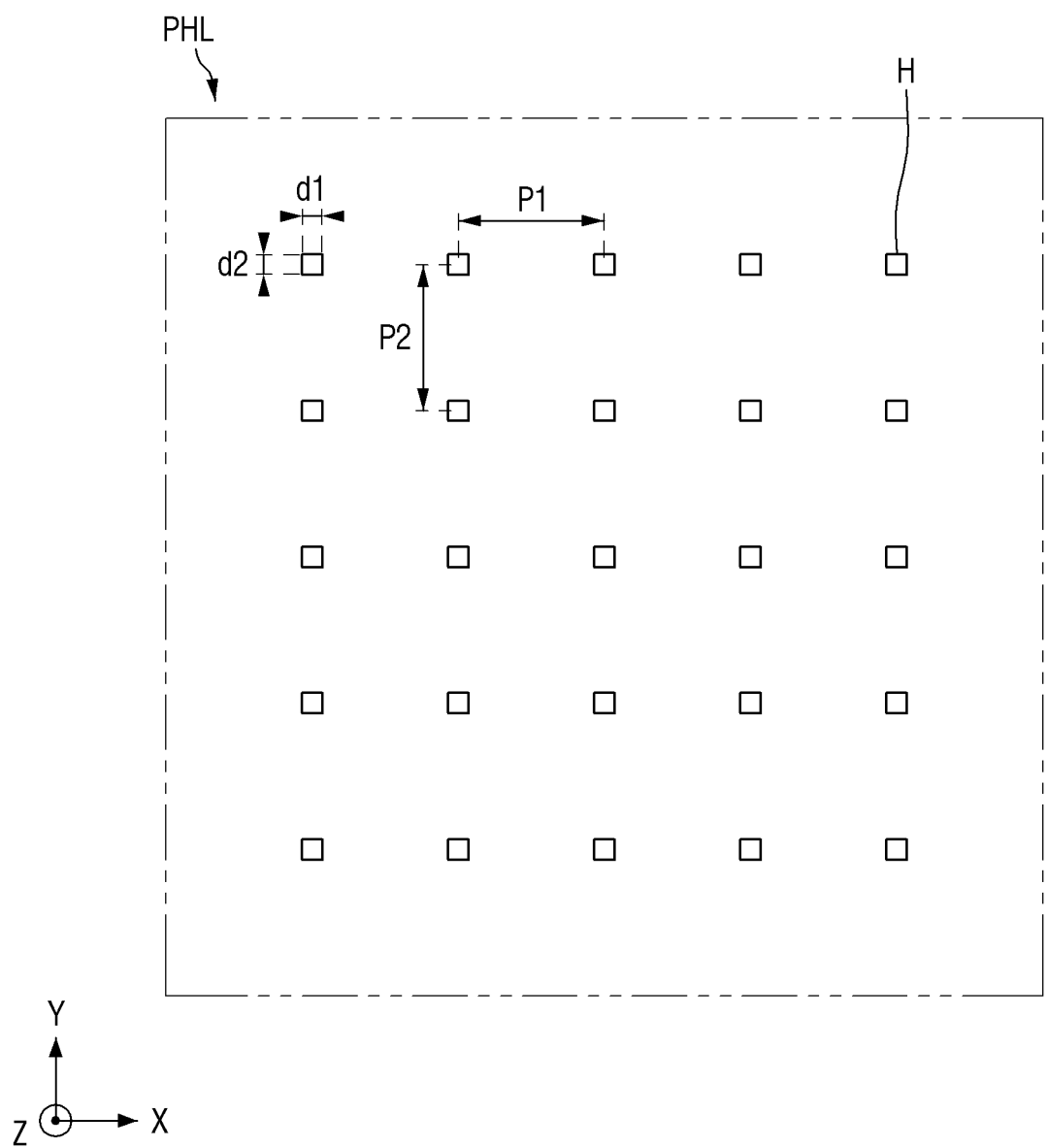
FIG. 11 is a plan view of an example of the light blocking layer of the display device according to an embodiment.

FIG. 11 is a plan view of an example of the light blocking layer PHL of the display device 10 according to an embodiment. Holes H of FIG. 11 are different from the holes H of FIG. 10 in shape, and a description of elements identical to those described above will be given briefly or may not be repeated.

Referring to FIG. 11, a light blocking layer PHL may include a plurality of holes H. In some embodiments, the holes H may be square in a plan view. Each of the holes H may have a first length d1 in the first direction (X-axis direction) and a second length d2 in the second direction (Y-axis direction). The first length d1 of each of the holes H may be, for example, about 3 μm to about 20 μm, but embodiments are not limited thereto. In some embodiments, the second length d2 of each of the holes H may be the same as the first length d1. In some embodiments, the second length d2 of each of the holes H may be different than the first length d1.

The shape of each of the holes H is not limited to the circular shape or to the square shape illustrated in FIGS. 10 and 11. For example, each of the holes H may have any suitable shape such as, for example, an elliptical shape and a polygonal shape. The holes H may also have different shapes in the light blocking layer PHL. For example, at least one hole H from the plurality of holes H may have a different shape than the other holes H from the plurality of holes H.

Figure 12:
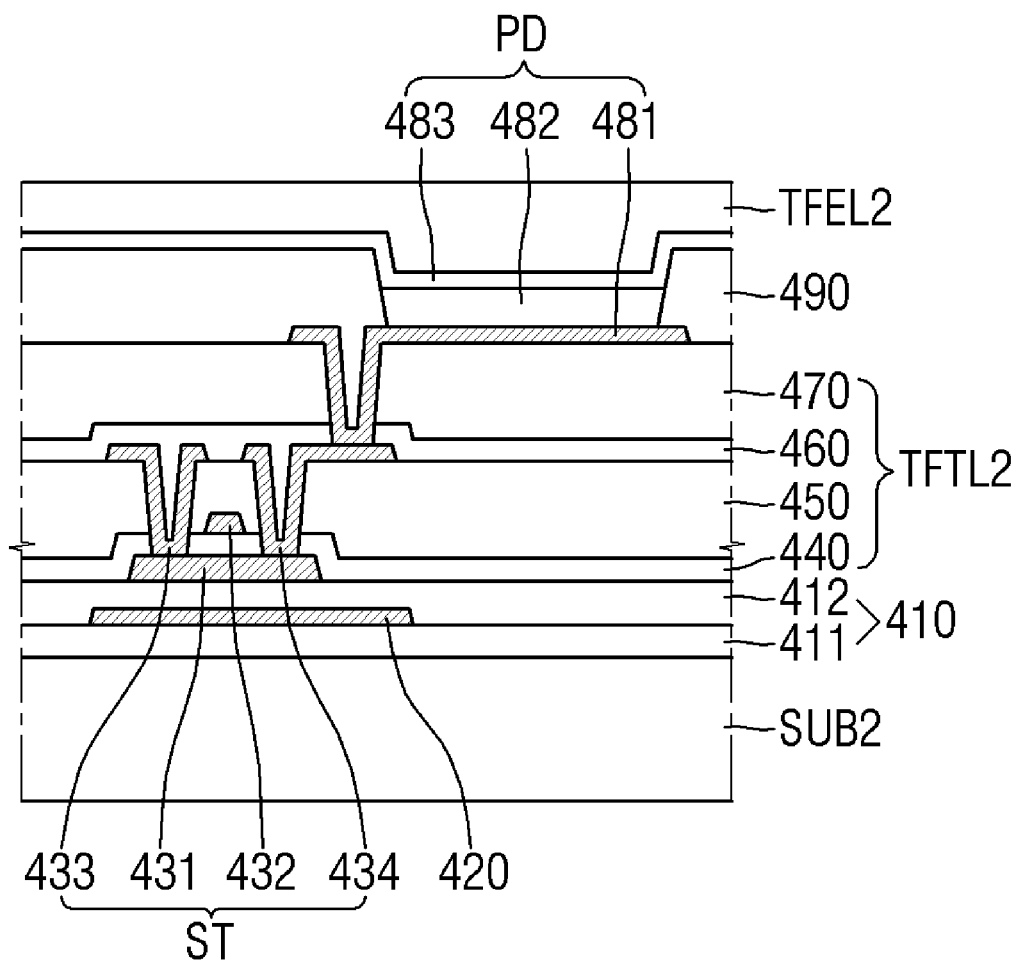
FIG. 12 is a cross-sectional view of the fingerprint sensor layer of the display device according to an embodiment.

FIG. 12 is a cross-sectional view of the fingerprint sensor layer FPSL of the display device 10 according to an embodiment. FIG. 12 may illustrate an embodiment of the fingerprint sensor layer FPSL before the fingerprint sensor layer FPSL is attached to the display panel 100. During some manufacturing processes of some embodiments of the display device 10, the fingerprint sensor layer FPSL illustrated in FIG. 12 may be turned upside down and then attached to a lower end (e.g., a lower surface) of the display panel 100. During some manufacturing processes of the embodiment of the display device 10, the fingerprint sensor layer FPSL may be formed directly at the lower end (e.g., on the lower surface) of the display panel 100.

Referring to FIG. 12, the fingerprint sensor layer FPSL may include the second substrate SUB2, the buffer layer 410, the second thin-film transistor layer TFTL2, the light receiving element layer PDL, and the second thin-film encapsulation layer TFEL2.

The second substrate SUB2 may be a base substrate and may include an insulating material such as, for example, polymer resin. In some embodiments, the second substrate SUB2 may be a rigid substrate. In some embodiments, the second substrate SUB2 may be a flexible substrate that can be bent, folded, and/or rolled. When the second substrate SUB2 is a flexible substrate, it may include polyimide (PI), but embodiments are not limited thereto.

The buffer layer 410 may include a first buffer layer 411 and a second buffer layer 412. The first buffer layer 411 may be on the second substrate SUB2. The first buffer layer 411 may include an inorganic layer that can prevent or reduce permeation or penetration of air and/or moisture. The first buffer layer 411 may include at least one inorganic layer selected from a silicon nitride layer, a silicon oxynitride layer, a silicon oxide layer, a titanium oxide layer, and an aluminum oxide layer, but embodiments are not limited thereto.

The second buffer layer 412 may be on the first buffer layer 411 and may cover a patterned light blocking pattern 420 on the first buffer layer 411. The second buffer layer 412 may include an inorganic layer that can prevent or reduce permeation or penetration of air and/or moisture. For example, the second buffer layer 412, together with the first buffer layer 411, may improve resistance to moisture permeability and/or penetrability of the fingerprint sensor layer FPSL.

The light blocking pattern 420 may be between the first and second buffer layers 411 and 412 and may overlap a switching transistor ST. The light blocking pattern 420 may be formed, for example, by depositing a light absorbing material on the first buffer layer 411 and then performing exposure patterning. The light blocking pattern 420 may include a metal such as, for example, molybdenum (Mo), aluminum (Al), chromium (Cr), gold (Au), or an alloy of the same, but embodiments are not limited thereto.

The second thin-film transistor layer TFTL2 may be on the buffer layer 410. The second thin-film transistor layer TFTL2 may include the switching transistor ST for driving each of the fingerprint sensors FPS. The second thin-film transistor layer TFTL2 may further include a gate insulating layer 440, an interlayer insulating film 450, a protective layer 460, and a planarization layer 470. The switching transistor ST of each fingerprint sensor FPS may include a semiconductor layer 431, a gate electrode 432, a source electrode 433, and a drain electrode 434.

The semiconductor layer 431 may be on the buffer layer 410. The semiconductor layer 431 may overlap the gate electrode 432, the source electrode 433, and the drain electrode 434. The semiconductor layer 431 may directly contact the source electrode 433 and the drain electrode 434, and the semiconductor layer 431 may face the gate electrode 432 with the gate insulating layer 440 between them.

The gate electrode 432 may be on the gate insulating layer 440.

The source electrode 433 and the drain electrode 434 may be on the interlayer insulating film 450 and may be spaced apart from each other. The source electrode 433 may contact an end (e.g., a side) of the semiconductor layer 431 through a first contact hole in the gate insulating layer 440 and the interlayer insulating film 450. The drain electrode 434 may contact the other end (e.g., the other side) of the semiconductor layer 431 through a second contact hole in the gate insulating layer 440 and the interlayer insulating film 450. The drain electrode 434 may directly contact a first electrode 481 of a light receiving element PD through a third contact hole in the protective layer 460 and, in some embodiments, also through the planarization layer 470.

The gate insulating layer 440 may be on the semiconductor layer 431. For example, the gate insulating layer 440 may be on the semiconductor layer 431 and on the buffer layer 410. The gate insulating layer 440 may also insulate the semiconductor layer 431 from the gate electrode 432. The gate insulating layer 440 may include the first contact hole through which the source electrode 433 passes and the second contact hole through which the drain electrode 434 passes.

The interlayer insulating film 450 may be on the gate electrode 432. In some embodiments, the interlayer insulating film 450 may include a first contact hole through which the source electrode 433 passes and a second contact hole through which the drain electrode 434 passes. In some embodiments, each of the first contact hole and the second contact hole of the interlayer insulating film 450 may be connected to the first contact hole and the second contact hole of the gate insulating layer 440, respectively.

The protective layer 460 may be on the switching transistor ST to protect the switching transistor ST. In some embodiments, the protective layer 460 may include the third contact hole through which the first electrode 481 of the light receiving element PD passes.

The planarization layer 470 may be on the protective layer 460 to planarize an upper end of the switching transistor ST. In some embodiments, the planarization layer 470 may include a third contact hole through which the first electrode 481 of the light emitting element PD passes. In some embodiments, the third contact hole of the protective layer 460 and the third contact hole of the planarization layer 470 may be connected to each other so that the first electrode 481 of the light receiving element PD can pass through the third contact holes.

The light receiving element layer PDL may be on the second thin-film transistor layer TFTL2. The light receiving element layer PDL may include the light receiving element PD connected to the switching transistor ST of the second thin-film transistor layer TFTL2. The light receiving element PD may not overlap the light blocking pattern 420.

The light receiving element PD may include the first electrode 481, a light receiving layer 482, and a second electrode 483.

The first electrode 481 may be on the planarization layer 470. For example, the first electrode 481 may overlap an opening area of the light receiving element layer PDL defined by a sensor defining layer 490. In addition, the first electrode 481 may contact the drain electrode 434 of the switching transistor ST through the third contact holes in the planarization layer 470 and the protective layer 460. In some embodiments, the first electrode 481 may include a transparent conductive material to transmit the second light L2 reflected by the finger F and may serve as an anode of the light receiving element PD.

The light receiving layer 482 may be on the first electrode 481. The light receiving layer 482 may include at least one of a hole injection layer, a hole transport layer, a light receiving layer, an electron blocking layer, an electron transport layer, an electron injection layer, and the like. In some embodiments, the light receiving layer 482 may include an organic light receiving layer including an organic material, but embodiments are not limited thereto. When the light receiving layer 482 is an organic light receiving layer, the organic light receiving layer may combine holes and electrons by receiving the second light L2 and converting the energy of the second light L2 into an electrical signal (current or voltage) between the first electrode 481 and the second electrode 483.

The second electrode 483 may be on the light receiving layer 482. In some embodiments, the second electrode 483 may not be specific (e.g., may not correspond) to individual fingerprint sensors FPS, but may be common to all fingerprint sensors FPS. When a driving voltage is applied to the first electrode 481 and a common voltage is applied to the second electrode 483, holes and electrons may move to the light receiving layer 482 and combine together. The second electrode 483 may serve as a cathode of the light receiving element PD.

The light receiving element layer PDL may include the sensor defining layer 490 which defines the fingerprint sensors FPS. The sensor defining layer 490 may be on the planarization layer 470. The sensor defining layer 490 may be between adjacent first electrodes 481 to separate the first electrodes 481. The sensor defining layer 490 may electrically insulate adjacent first electrodes 481 and adjacent light receiving layers 482, thereby defining the opening area of the light receiving element layer PDL.

The second thin-film encapsulation layer TFEL2 may be on the light receiving element layer PDL. The second thin-film encapsulation layer TFEL2 may cover the light receiving element layer PDL and may prevent or reduce permeation or penetration of oxygen and/or moisture into the light receiving element layer PDL. For example, the second thin-film encapsulation layer TFEL2 may include at least one inorganic layer. The second thin-film encapsulation layer TFEL2 may include an inorganic layer such as, for example, a silicon nitride layer, a silicon oxynitride layer, a silicon oxide layer, a titanium oxide layer, and/or an aluminum oxide layer, but embodiments are not limited thereto.

The second thin-film encapsulation layer TFEL2 may protect the light receiving element layer PDL from foreign substances such as, for example, dust. For example, the second thin-film encapsulation layer TFEL2 may include at least one organic layer. The second thin-film encapsulation layer TFEL2 may include an organic layer such as, for example, acryl resin, epoxy resin, phenolic resin, polyamide resin, and/or polyimide resin, but embodiments are not limited thereto.

Figure 13:
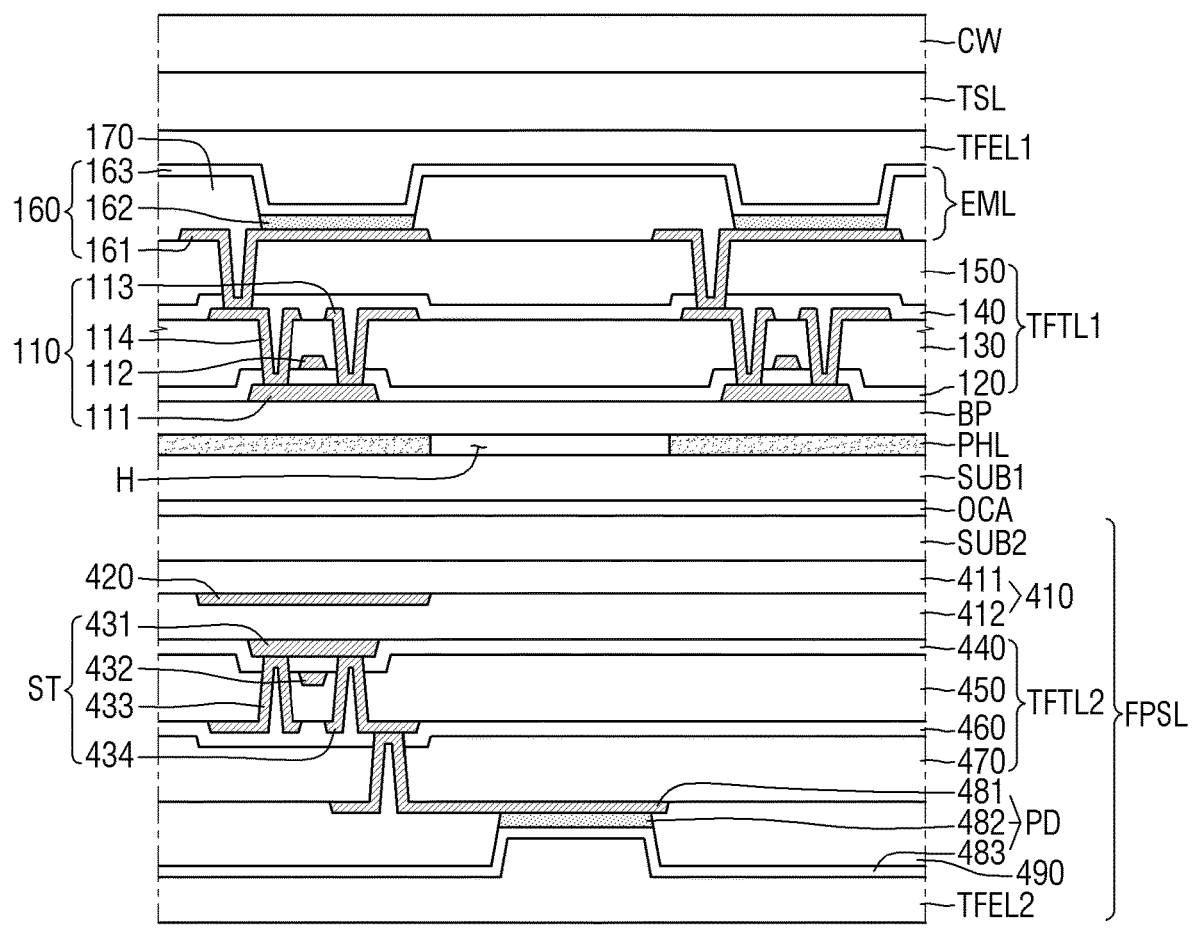
FIG. 13 is a cross-sectional view of the display device according to an embodiment.
Figure 14:
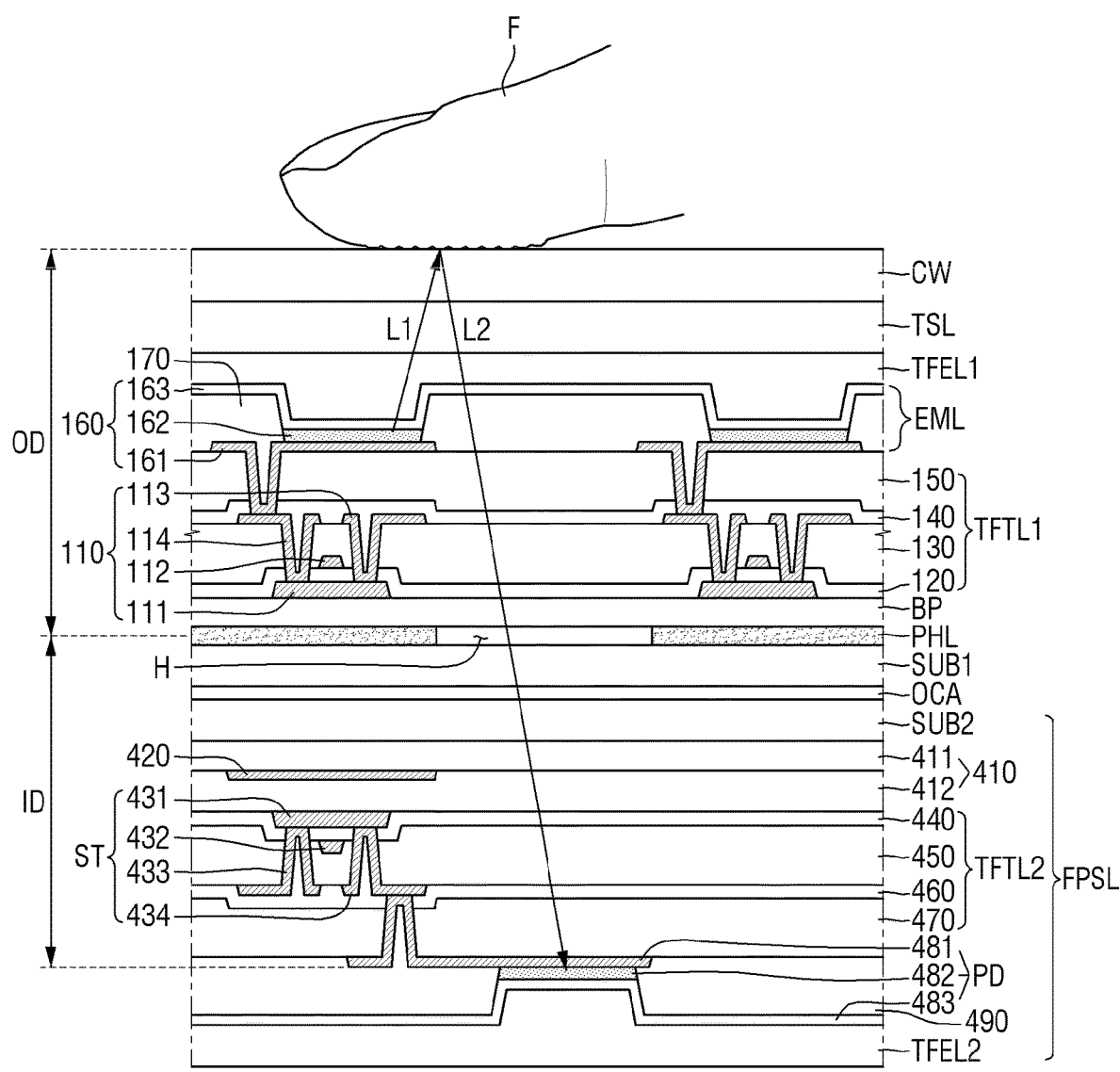
FIG. 14 is a cross-sectional view illustrating a reflection path of light in the display device of FIG. 13, according to an embodiment.

FIG. 13 is a cross-sectional view of the display device 10 according to an embodiment. FIG. 14 is a cross-sectional view illustrating a reflection path of light in the display device 10 of FIG. 13, according to an embodiment. In some embodiments, the fingerprint sensor layer FPSL of FIGS. 13 and 14 may be the fingerprint sensor layer FPSL of FIG. 12 turned upside down and then attached to the lower end of the display panel 100.

Referring to FIGS. 13 and 14, the display device 10 may include the first substrate SUB1, the light blocking layer PHL, the display panel 100, the cover window CW, and the fingerprint sensor layer FPSL. The display panel 100 may include the backplane BP, the first thin-film transistor layer TFTL1, the light emitting element layer EML, the first thin-film encapsulation layer TFEL1, and the touch sensor layer TSL. The fingerprint sensor layer FPSL may include the second substrate SUB2, the buffer layer 410, the second thin-film transistor layer TFTL2, the light receiving element layer PDL, and the second thin-film encapsulation layer TFEL2.

The first substrate SUB1 may be a base substrate and may include an insulating material such as, for example, polymer resin. In some embodiments, the first substrate SUB1 may be a rigid substrate. In some embodiments, the first substrate SUB1 may be a flexible substrate that can be bent, folded, and/or rolled. When the first substrate SUB1 is a flexible substrate, it may include polyimide (PI), but embodiments are not limited thereto.

The light blocking layer PHL may cover the lower surface of the first thin-film transistor layer TFTL1. The light blocking layer PHL may be between the first substrate SUB1 and the first thin-film transistor layer TFTL1 to block light from entering the first thin-film transistor layer TFTL1 and the light emitting element layer EML.

The light blocking layer PHL may include the holes H. The holes H may be (e.g., may provide) optical passages through which the second light L2 reflected by the body of a user, after being output from the light emitting element layer EML as first light L1, travels toward the fingerprint recognition sensor layer FPSL.

The backplane BP may be on the light blocking layer PHL and may support (e.g., may be under or directly under) the first thin-film transistor layer TFTL1. In some embodiments, the backplane BP may include an insulating material such as, for example, polymer resin.

The first thin-film transistor layer TFTL1 may be on the backplane BP. The first thin-film transistor layer TFTL1 may include one or more thin-film transistors 110 for driving each of the subpixels SP. The first thin-film transistor layer TFTL1 may further include a gate insulating layer 120, an interlayer insulating film 130, a protective layer 140, and a planarization layer 150. Each of the thin-film transistors 110 may include a semiconductor layer 111, a gate electrode 112, a source electrode 113, and a drain electrode 114.

The semiconductor layer 111 may be on the backplane BP. The semiconductor layer 111 may overlap the gate electrode 112, the source electrode 113, and the drain electrode 114. The semiconductor layer 111 may directly contact the source electrode 113 and the drain electrode 114, and the semiconductor layer 111 may face the gate electrode 112 with the gate insulating layer 120 between them.

The gate electrode 112 may be on the gate insulating layer 120.

The source electrode 113 and the drain electrode 114 may be on the interlayer insulating film 130 and may be spaced apart from each other. The source electrode 113 may contact an end (e.g., a side) of the semiconductor layer 111 through contact holes in the gate insulating layer 120 and the interlayer insulating film 130. The drain electrode 114 may contact the other end (e.g., the other side) of the semiconductor layer 111 through contact holes in the gate insulating layer 120 and the interlayer insulating film 130. The drain electrode 114 may directly contact a first electrode 161 of a light emitting element 160 through a contact hole in the protective layer 140 and, in some embodiments, the planarization layer 150.

The gate insulating layer 120 may be on the semiconductor layer 111. In some embodiments, the gate insulating layer 120 may be on the semiconductor layer 111 and on the backplane BP, and the gate insulating layer 120 may insulate the semiconductor layer 111 from the gate electrode 112. The gate insulating layer 120 may include the contact hole through which the source electrode 113 passes and the contact hole through which the drain electrode 114 passes.

The interlayer insulating film 130 may be on the gate electrode 112. In some embodiments, the interlayer insulating film 130 may include the contact hole through which the source electrode 113 passes and the contact hole through which the drain electrode 114 passes. In some embodiments, the contact holes of the interlayer insulating film 130 may be connected to the contact holes of the gate insulating layer 120.

The protective layer 140 may be on the thin-film transistors 110 to protect the thin-film transistors 110. In some embodiments, the protective layer 140 may include the respective contact hole through which the first electrode 161 of each light emitting element 160 passes.

The planarization layer 150 may be on the protective layer 140 to planarize an upper end (e.g., an upper surface) of each thin-film transistor 110. In some embodiments, the planarization layer 150 may include a respective contact hole through which the first electrode 161 of each light emitting element 160 passes. In some embodiments, the contact hole of the protective layer 140 and the contact hole of the planarization layer 150 may be connected to each other so that the first electrode 161 of each light emitting element 160 can pass through the respective contact holes.

The light emitting element layer EML may be on the first thin-film transistor layer TFTL1. The light emitting element layer EML may include the light emitting elements 160 connected to the thin-film transistors 110 of the first thin-film transistor layer TFTL1.

Each of the light emitting elements 160 may include the first electrode 161, a light emitting layer 162, and a second electrode 163.

The first electrode 161 may be on the planarization layer 150. In some embodiments, the first electrode 161 may overlap an opening area of the light emitting element layer EML defined by a pixel defining layer 170. In addition, the first electrode 161 may contact the drain electrode 114 of each thin-film transistor 110 through the respective contact holes in the planarization layer 150 and the protective layer 140. In some embodiments, the first electrode 161 may serve as an anode of each light emitting element 160.

The light emitting layer 162 may be on the first electrode 161. The light emitting layer 162 may include a hole injection layer, a hole transport layer, a light emitting layer, an electron blocking layer, an electron transport layer, an electron injection layer, and/or the like. In some embodiments, the light emitting layer 162 may include an organic light emitting layer including an organic material, but embodiments are not limited thereto. When the light emitting layer 162 includes an organic light emitting layer, a hole transport layer and an electron transport layer, if a thin-film transistor 110 of the first thin-film transistor layer TFTL1 applies a predetermined or set voltage to the first electrode 161 of a corresponding light emitting element 160, and the second electrode 163 of the light emitting element 160 receives a common voltage or a cathode voltage, then holes and electrons may move to the organic light emitting layer through the hole transport layer and the electron transport layer, respectively, and combine together in the organic light emitting layer 162 to emit light.

The second electrode 163 may be on the light emitting layer 162. In some embodiments, the second electrode 163 may not be specific (e.g., may not correspond) to individual subpixels SP but may be common to all subpixels SP.

The light emitting element layer EML may include the pixel defining layer 170 which defines the subpixels SP. The first electrodes 161 and the light emitting layers 162 of the light emitting elements 160 may be spaced apart and insulated from each other by the pixel defining layer 170.

The first thin-film encapsulation layer TFEL1 may be on the light emitting element layer EML and may cover the first thin-film transistor layer TFTL1 and the light emitting element layer EML. The first thin-film encapsulation layer TFEL1 may prevent or reduce permeation or penetration of oxygen and/or moisture into the light emitting element layer EML.

The touch sensor layer TSL may be on the first thin-film encapsulation layer TFEL1. The touch sensor layer TSL may include touch electrodes to sense a user's touch and touch electrode lines connecting pads and the touch electrodes (e.g., connecting pads to the touch electrodes). The touch electrodes of the touch sensor layer TSL may be in the touch sensing area which overlaps the display area DA of the display panel 100.

The cover window CW may be on the display panel 100. The cover window CW may be on the touch sensor layer TSL of the display panel 100. For example, the cover window CW may be attached onto the touch sensor layer TSL by a transparent adhesive member. In some embodiments, the cover window CW can be directly touched by the user's finger F.

The fingerprint sensor layer FPSL may be under the display panel 100. For example, the fingerprint sensor layer FPSL may be under the first substrate SUB1. The upper end (e.g., the upper surface) of the first substrate SUB1 may face the display panel 100 and/or the light blocking layer PHL, and the lower end (e.g., the lower surface) of the first substrate SUB1 may face the fingerprint sensor layer FPSL. In some embodiments, the upper end (e.g., the upper surface) of the fingerprint sensor layer FPSL may be attached to the lower end (e.g., the lower surface) of the first substrate SUB1 by a transparent adhesive member.

In FIG. 14, when the user's finger F touches the cover window CW, the first light L1 output from the light emitting element layer EML may be reflected by a ridge FR or by a valley FV of the finger F, and the reflected second light L2 may pass through a hole H of the light blocking layer PHL to reach (e.g., to travel to) the fingerprint sensor layer FPSL under the first substrate SUB1.

The fingerprint sensor layer FPSL may include the second substrate SUB2, the buffer layer 410, the second thin-film transistor layer TFTL2, the light receiving element layer PDL, and the second thin-film encapsulation layer TFEL2.

The second substrate SUB2 may be attached to the bottom (e.g., the lower surface) of the first substrate SUB1 by the adhesive member OCA. The upper end (e.g., the upper surface) of the second substrate SUB2 may face the lower end (e.g., the lower surface) of the first substrate SUB1. In some embodiments, the upper end (e.g., the upper surface) of the second substrate SUB2 may be attached to the lower end (e.g., the lower surface) of the first substrate SUB1 by the adhesive member OCA.

The buffer layer 410 may include the first buffer layer 411 and the second buffer layer 412. The first buffer layer 411 may be at the lower end (e.g., at the lower surface) of the second substrate SUB2, and the second buffer layer 412 may cover lower ends (e.g., lower surfaces) of the first buffer layer 411 and of the light blocking pattern 420. The first and second buffer layers 411 and 412 may include an inorganic layer that can prevent or reduce permeation or penetration of air and/or moisture.

The light blocking pattern 420 may be between the first and second buffer layers 411 and 412 and may overlap a switching transistor ST. The light blocking pattern 420 may prevent or reduce the second light L2 reflected by the finger F from entering the switching transistor ST.

The second thin-film transistor layer TFTL2 may be at the lower end (e.g., at the lower surface) of the buffer layer 410. The upper end (e.g., the upper surface) of the second thin-film transistor TFTL2 may face the lower end (e.g., the lower surface) of the buffer layer 410. The second thin-film transistor layer TFTL2 may include the switching transistor ST for driving each of the fingerprint sensors FPS. The second thin-film transistor layer TFTL2 may further include the gate insulating layer 440, the interlayer insulating film 450, the protective layer 460, and the planarization layer 470. The switching transistor ST of each fingerprint sensor FPS may include the semiconductor layer 431, the gate electrode 432, the source electrode 433, and the drain electrode 434.

The semiconductor layer 431 may be under the buffer layer 410. The semiconductor layer 431 may overlap the gate electrode 432, the source electrode 433, and the drain electrode 434.

The gate electrode 432 may be under the gate insulating layer 440. The gate electrode 432 may overlap the semiconductor layer 431 with the gate insulating layer 440 between them.

The source electrode 433 and the drain electrode 434 may be under the interlayer insulating film 450 and may be spaced apart from each other. The drain electrode 434 may directly contact the first electrode 481 of a light receiving element PD through contact holes in the protective layer 460 and the planarization layer 470.

The gate insulating layer 440 may be under the semiconductor layer 431. For example, the gate insulating layer 440 may be under the semiconductor layer 431 and under the buffer layer 410 and may insulate the semiconductor layer 431 from the gate electrode 432.

The interlayer insulating film 450 may be under the gate electrode 432. The interlayer insulating film 450 may cover lower ends (e.g., the lower surfaces) of the gate electrode 432 and the gate insulating layer 440 and may insulate each of the source electrode 433 and the drain electrode 434 from the gate electrode 432.

The protective layer 460 may be under the switching transistor ST to protect the switching transistor ST.

The planarization layer 470 may be under the protective layer 460 to planarize a lower end (e.g., a lower surface) of the switching transistor ST.

The light receiving element layer PDL may be at the lower end (e.g., at the lower surface) of the second thin-film transistor layer TFTL2. The upper end (e.g., the upper surface) of the light receiving element layer PDL may face the lower end (e.g., the lower surface) of the second thin-film transistor layer TFTL2. The light receiving element layer PDL may include the light receiving element PD connected to the switching transistor ST of the second thin-film transistor layer TFTL2. The light receiving element PD may include the first electrode 481, the light receiving layer 482, and the second electrode 483.

The first electrode 481 may be under the planarization layer 470. In some embodiments, the first electrode 481 may overlap an opening area of the light receiving element layer PDL defined by the sensor defining layer 490. For example, the first electrode 481 may include a transparent conductive material to transmit the second light L2 reflected by the finger F and may serve as an anode of the light receiving element PD.

The light receiving layer 482 may be under the first electrode 481. In some embodiments, when the light receiving layer 482 is an organic light receiving layer, the organic light receiving layer may combine holes and electrons by receiving the second light L2 and converting the energy of the second light L2 into an electrical signal (current or voltage) between the first electrode 481 and the second electrode 483.

The second electrode 483 may be under the light receiving layer 482. In some embodiments, the second electrode 483 may not be specific (e.g., may not correspond) to individual fingerprint sensors FPS but may be common to all fingerprint sensors FPS. The second electrode 483 may serve as a cathode of the light receiving element PD.

The light receiving element layer PDL may include the sensor defining layer 490 which defines the fingerprint sensors FPS. The sensor defining layer 490 may be under the planarization layer 470. The sensor defining layer 490 may be between adjacent first electrodes 481 to separate the first electrodes 481. The sensor defining layer 490 may electrically insulate adjacent first electrodes 481 and adjacent light receiving layers 482, thereby defining the opening area of the light receiving element layer PDL.

The second thin-film encapsulation layer TFEL2 may be at the lower end (e.g., the lower surface) of the light receiving element layer PDL. The upper end (e.g., the upper surface) of the second thin-film encapsulation layer TFEL2 may face the lower end (e.g., the lower surface) of the light receiving element layer PDL. The second thin-film encapsulation layer TFEL2 may cover the lower surface of the light receiving element layer PDL and may prevent or reduce permeation or penetration of oxygen and/or moisture into the light receiving element layer PDL. In addition, the second thin-film encapsulation layer TFEL2 may protect the light receiving element layer PDL from foreign substances such as, for example, dust.

In FIG. 14, the display device 10 may sense light reflected by the user's finger F through the light receiving element PD of each fingerprint sensor FPS by adjusting the ratio of the fingerprint distance OD to the sensor distance ID. In some embodiments, light reflected at one end of (e.g., one side) a fingerprint pixel FPP of the cover window CW may pass through a center point of a hole H to reach (e.g., to travel to) the other end (e.g., the other side) of a group of fingerprint sensors FPS. In addition, light reflected at the other end (e.g., the other side) of the fingerprint pixel FPP of the cover window CW may pass through the center point of the hole H to reach (e.g., to travel to) one end (e.g., one side) of the group of the fingerprint sensors FPS. In some such embodiments, the one end (e.g., one side) of the finger print pixel FPP may correspond to the one end (e.g., one side) of the group of the fingerprint sensors FPS, and the other end (e.g., the other side) of the fingerprint pixel FPP may correspond to the other end (e.g., the other side) of the group of fingerprint sensors FPS. Therefore, the shape of a fingerprint directly contacting the fingerprint pixel FPP may be 180 degrees different from an image of the fingerprint on the group of the fingerprint sensors FPS. The display device 10 may improve the sensitivity of the fingerprint sensors FPS by adjusting the ratio of the fingerprint distance OD to the sensor distance ID and by adjusting the arrangement and shape of the holes H of the light blocking layer PHL.

The fingerprint distance OD may be the distance between the surface of the cover window CW that the user's finger F directly touches and a center point of a hole H of the light blocking layer PHL. In some embodiments, the fingerprint distance OD may be the sum of the thicknesses of the cover window CW, the touch sensor layer TSL, the first thin-film encapsulation layer TFEL1, the light emitting element layer EML, the first thin-film transistor layer TFTL1, and the backplane BP.

The sensor distance ID may be the distance between the center point of the hole H of the light blocking layer PHL and a fingerprint sensor FPS of the fingerprint sensor layer FPSL. In some embodiments, the sensor distance ID may be the sum of the thicknesses of the first substrate SUB1, the adhesive member OCA, the second substrate SUB2, the buffer layer 410, the second thin-film transistor layer TFTL2, and the first electrode 481 of the light receiving element PD.

During some manufacturing processes of some embodiments of the display device 10, the fingerprint sensor layer FPSL may be turned upside down and then attached to the lower end (e.g., the lower surface) of the display panel 100. Therefore, a thickness of the fingerprint sensor layer FPSL can be reduced while the ratio of the fingerprint distance OD to the sensor distance ID is maintained. In some embodiments, because the fingerprint sensor layer FPSL may be turned upside down and attached to the lower end (e.g., the lower surface) of the display panel 100 during some manufacturing processes of the display device 10, the second substrate SUB2 may be between the fingerprint sensor layer FPSL and the display panel 100 and may serve as an encapsulation substrate of the fingerprint sensor layer FPSL. Therefore, the display device 10 may include no additional substrates other than the second substrate SUB2 of the fingerprint sensor layer FPSL and may include no additional layers to maintain the ratio of the fingerprint distance OD to the sensor distance ID. The reduced thickness of the fingerprint sensor layer FPSL may minimize or reduce the thickness of the display device 10.

In some embodiments, the thickness of the fingerprint sensor layer FPSL may be smaller than that of the cover window CW. In some embodiments, because the fingerprint sensor layer FPSL may include no additional substrates other than the second substrate SUB2 and may include no additional layers to maintain the ratio of the fingerprint distance OD to the sensor distance ID, the thickness of the fingerprint sensor layer FPSL may be smaller than that of the cover window CW.

In some embodiments, a distance between an upper end (e.g., an upper surface) of the cover window CW and an upper end (e.g., an upper surface) of the light blocking layer PHL may be longer than a distance between a lower end (e.g., a lower surface) of the light blocking layer PHL and a lower end (e.g., a lower surface) of the fingerprint sensor layer FPSL. In some embodiments, because the fingerprint sensor layer FPSL may be turned upside down and then attached to the lower end (e.g., the lower surface) of the display panel 100 during some manufacturing processes of the display device 10, no additional substrates or layers are required, and the thickness of the fingerprint sensor layer FPSL can be reduced while the ratio of the fingerprint distance OD to the sensor distance ID is maintained.

In some embodiments, the thickness of the cover window CW may be greater than the distance between the lower end (e.g., the lower surface) of the light blocking layer PHL and the lower end (e.g., the lower surface) of the fingerprint sensor layer FPSL. As described above, the thickness of the cover window CW may be greater than the thickness of the fingerprint sensor layer FPSL. In some embodiments, the thickness of the cover window CW may be greater than the sum of the thicknesses of the fingerprint sensor layer FPSL, the adhesive member OCA, and the first substrate SUB1.

In some embodiments, a ratio of the distance (e.g., the fingerprint distance OD) between the upper end (e.g., the upper surface) of the cover window CW and the upper end (e.g., the upper surface) of the light blocking layer PHL to the distance between the lower end (e.g., the lower surface) of the light blocking layer PHL and the lower end (e.g., the lower surface) of the fingerprint sensor layer FPSL may be about 1.5:1 to about 1.9:1, or, in some embodiments, may be about 1.69:1. In some embodiments, the distance between the lower end (e.g., the lower surface) of the light blocking layer PHL and the lower end (e.g., the lower surface) of the fingerprint sensor layer FPSL may be the sum of the sensor distance ID and the thicknesses of the light receiving layer 482, the second electrode 483 of the light receiving element PD and the second thin-film transistor layer TFEL2.

The distance (e.g., the fingerprint distance OD) between the upper end (e.g., the upper surface) of the cover window CW and the upper end (e.g., the upper surface) of the light blocking layer PHL may be the thickness of the display device 10 above the light blocking layer PHL The distance between the lower end (e.g., the lower surface) of the light blocking layer PHL and the lower end (e.g., the lower surface) of the fingerprint sensor layer FPSL may be the thickness of the display device 10 under the light blocking layer PHL. Therefore, because the thickness of the fingerprint sensor layer FPSL is reduced in the display device 10 while the ratio of the fingerprint distance OD to the sensor distance ID is maintained, the thickness of a lower part of the display device 10 (e.g., the thickness of the display device 10 under the light blocking layer PHL) can be reduced.

Figure 15:
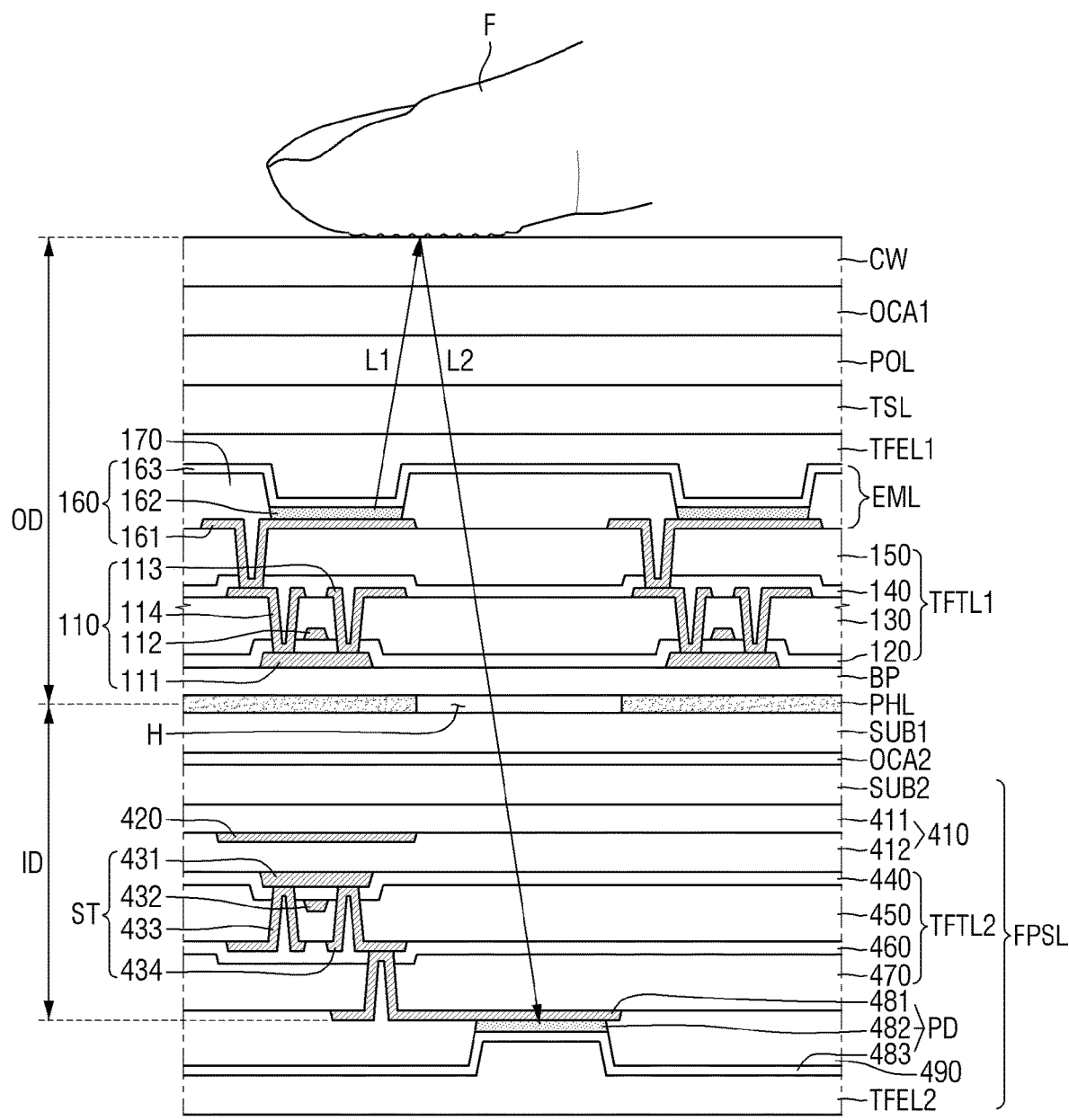
FIG. 15 is a cross-sectional view of a display device according to an embodiment.

FIG. 15 is a cross-sectional view of a display device 10 according to an embodiment. The display device 10 of FIG. 15 includes a polarizing layer POL and a first adhesive member OCA1 between a touch sensing layer TSL and a cover window CW in addition to the elements of the display device 10 illustrated in FIGS. 13 and 14. In the embodiment illustrated in FIG. 15, the adhesive member that connects the first substrate SUB1 to the second substrate SUB2 is referred to as the second adhesive member OCA2, in order to distinguish the first adhesive member OCA1 from the second adhesive member OCA2. A description of elements identical to those described above will be given briefly or may not be repeated.

Referring to FIG. 15, the polarizing layer POL may be on the touch sensing layer TSL, and the first adhesive member OCA1 may be between the polarizing layer POL and the cover window CW.

The polarizing layer POL may be on the touch sensing layer TSL to prevent or reduce reflection of external light. In some embodiments, the polarizing layer POL may include a linear polarizer and a retardation film such as, for example, a quarter-wave ($\lambda/4$) plate. In some embodiments, the retardation film may be on the touch sensor layer TSL, and the linear polarizer may be on the retardation film. The cover window CW may be attached onto the polarizing layer POL by the first adhesive member OCA1.

The display device 10 may sense light reflected by a user's finger F through a light receiving element PD of a fingerprint sensor FPS by adjusting a ratio of a fingerprint distance OD to a sensor distance ID.

The fingerprint distance OD may be a distance between a surface of the cover window CW that the user's finger F directly touches and a center point of a hole H of a light blocking layer PHL. In some embodiments, the fingerprint distance OD may be the sum of the thicknesses of the cover window CW, the first adhesive member OCA1, the polarizing layer POL, the touch sensor layer TSL, a first thin-film encapsulation layer TFEL1, a light emitting element layer EML, a first thin-film transistor layer TFTL1, and a backplane BP.

The sensor distance ID may be a distance between the center point of the hole H of the light blocking layer PHL and the fingerprint sensor FPS of a fingerprint sensor layer FPSL.

In some embodiments, the fingerprint sensor layer FPSL may be turned upside down and then attached to a lower end (e.g., a lower surface) of a display panel 100 during some manufacturing processes of the display device 10. Therefore, a thickness of the fingerprint sensor layer FPSL can be reduced while the ratio of the fingerprint distance OD to the sensor distance ID is maintained. In some embodiments, because the fingerprint sensor layer FPSL is turned upside down and attached to the lower end (e.g., the lower surface) of the display panel 100 during some manufacturing processes of the display device 10, a second substrate SUB2 may be between the fingerprint sensor layer FPSL and the display panel 100 and may serve as an encapsulation substrate of the fingerprint sensor layer FPSL. Therefore, the display device 10 may include no additional substrates other than the second substrate SUB2 of the fingerprint sensor layer FPSL and may include no additional layers to maintain the ratio of the fingerprint distance OD to the sensor distance ID. The reduced thickness of the fingerprint sensor layer FPSL may minimize or reduce a thickness of the display device 10.

In some embodiments, the sum of the thicknesses of the touch sensor layer TSL, the polarizing layer POL and the first adhesive member OCA1 may be greater than the thickness of the fingerprint sensor layer FPSL. In some embodiments, because the fingerprint sensor layer FPSL may include no additional substrates other than the second substrate SUB2 and may include no additional layers to maintain the ratio of the fingerprint distance OD to the sensor distance ID, the thickness of the fingerprint sensor layer FPSL may be smaller than the sum of the thicknesses of the touch sensor layer TSL, the polarizing layer POL and the first adhesive member OCA1.

A display device according to some embodiments recognizes a fingerprint using (e.g., utilizing) light output from a display panel. Therefore, the display device can recognize a fingerprint without a light source.

A thickness of a display device including a fingerprint sensor layer according to some embodiments can be minimized or reduced.

In a display device according to some embodiments, the number of layers constituting a fingerprint sensor layer can be minimized or reduced to secure a space for other elements of the display device.

However, the aspects, effects, features, and/or elements of the embodiments of the present disclosure are not restricted or limited to the embodiments illustrated and described herein. The above and other aspects, effects, features, and/or elements of the embodiments of the present disclosure will become more apparent to one of ordinary skill in the art to which the embodiments pertain by referencing the appended claims.

What is claimed is:

1. A display device comprising:
a first substrate;
a display panel above the first substrate, the display panel comprising:
a first thin-film transistor layer above the first substrate, and
a light emitting element layer on the first thin-film transistor layer; and
a fingerprint sensor layer under the first substrate to receive light output from the light emitting element layer and reflected by an external object above the display panel,
wherein the fingerprint sensor layer comprises:
a second substrate under the first substrate;
a second thin-film transistor layer under the second substrate; and
a light receiving element layer under the second thin-film transistor layer.

2. A display device comprising:
a first substrate;
a first thin-film transistor layer on the first substrate;
a light blocking layer between the first substrate and the first thin-film transistor layer;
a light emitting element layer on the first thin-film transistor layer; and
a fingerprint sensor layer to receive light reflected by an external object,
wherein the fingerprint sensor layer comprises:
a second substrate under the first substrate;
a second thin-film transistor layer under the second substrate; and
a light receiving element layer under the second thin-film transistor layer,
wherein the light blocking layer comprises a plurality of holes.

3. The display device of claim 2, further comprising:
a first thin-film encapsulation layer on the light emitting element layer; and
a cover window on the first thin-film encapsulation layer.

4. The display device of claim 3, wherein a thickness of the fingerprint sensor layer is smaller than a thickness of the cover window.

5. The display device of claim 3, wherein a distance between an upper end of the cover window and an upper end of the light blocking layer is greater than a distance between a lower end of the light blocking layer and a lower end of the fingerprint sensor layer.

6. The display device of claim 3, wherein a thickness of the cover window is greater than a distance between a lower end of the light blocking layer and a lower end of the fingerprint sensor layer.

7. The display device of claim 3, wherein a ratio of a distance between an upper end of the cover window and an upper end of the light blocking layer to a distance between a lower end of the light blocking layer and a lower end of the fingerprint sensor layer is about 1.5:1 to about 1.9:1.

8. The display device of claim 3, wherein the fingerprint sensor layer further comprises a second thin-film encapsulation layer under the light receiving element layer.

9. The display device of claim 3, wherein a distance between the holes is proportional to a thickness of the first thin-film encapsulation layer.

10. The display device of claim 3, wherein a distance between the holes is proportional to a distance between light emitting elements of the light emitting element layer.

11. The display device of claim 2, wherein the fingerprint sensor layer comprises a plurality of fingerprint sensors, and each of the holes corresponds to twenty to thirty fingerprint sensors.

12. The display device of claim 2, wherein the first thin-film transistor layer comprises a plurality of thin-film transistors, and each of the holes does not overlap the thin-film transistors.

13. The display device of claim 2, wherein the second thin-film transistor layer comprises a switching transistor, and the light receiving element layer comprises a first electrode under the second thin-film transistor layer and electrically connected to the switching transistor, a light receiving layer under the first electrode, and a second electrode under the light receiving layer to receive a common voltage.

14. The display device of claim 13, wherein the first electrode comprises a transparent electrode.

15. The display device of claim 13, wherein the fingerprint sensor layer further comprises a light blocking pattern between the second substrate and the second thin-film transistor layer to overlap the switching transistor.

16. The display device of claim 15, wherein the light blocking pattern does not overlap the light receiving layer.

17. The display device of claim 3, further comprising:
a touch sensor layer on the first thin-film encapsulation layer;
a polarizing layer on the touch sensor layer; and
an adhesive member between the polarizing layer and the cover window.

18. The display device of claim 17, wherein a sum of thicknesses of the touch sensor layer, the polarizing layer, and the adhesive member is greater than a thickness of the fingerprint sensor layer.

19. The display device of claim 1, wherein the second substrate is attached to a bottom of the first substrate by a transparent adhesive member.

20. The display device of claim 1, wherein the light receiving element layer comprises a phototransistor or a photodiode.

* * * * *